(12) United States Patent
Langhammer et al.

(10) Patent No.: US 11,210,063 B2
(45) Date of Patent: Dec. 28, 2021

(54) MACHINE LEARNING TRAINING ARCHITECTURE FOR PROGRAMMABLE DEVICES

(71) Applicant: Intel Corporation, Santa Clara, CA (US)

(72) Inventors: Martin Langhammer, Alderbury (GB); Bogdan Pasca, Toulouse (FR); Sergey Gribok, Santa Clara, CA (US); Gregg William Baeckler, San Jose, CA (US); Andrei Hagiescu, Toronto (CA)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 16/585,857

(22) Filed: Sep. 27, 2019

(65) Prior Publication Data

US 2020/0026494 A1 Jan. 23, 2020

Related U.S. Application Data

(60) Provisional application No. 62/824,797, filed on Mar. 27, 2019.

(51) Int. Cl.
*G06F 7/487* (2006.01)
*G06F 7/501* (2006.01)
(Continued)

(52) U.S. Cl.
CPC ............ *G06F 7/4876* (2013.01); *G06F 7/501* (2013.01); *G06F 9/30014* (2013.01); *G06F 17/16* (2013.01); *H03M 7/24* (2013.01)

(58) Field of Classification Search
CPC ........ G06F 7/4876; G06F 7/501; G06F 7/485; G06F 17/16; G06F 9/30014; G06F 2207/4824; H03M 7/24
(Continued)

(56) References Cited

U.S. PATENT DOCUMENTS 8,924,455 B1    12/2014  Barman et al.
9,747,110 B2 *   8/2017  Langhammer ............ G06F 7/57
(Continued)

OTHER PUBLICATIONS

J. V. Dillon,"Tensorflow distributions," CoRR, vol. abs/1711.10604,2017. [Online]. Retreived from; http://arxiv.org/abs/1711.10604.

(Continued)

*Primary Examiner* — Tan V Mai
(74) *Attorney, Agent, or Firm* — Fletcher Yoder, PC

(57) ABSTRACT

A programmable device may be configured to support machine learning training operations using matrix multiplication circuitry implemented on a systolic array. The systolic array includes an array of processing elements, each of which includes hybrid floating-point dot-product circuitry. The hybrid dot-product circuitry has a hard data path that uses digital signal processing (DSP) blocks operating in floating-point mode and a hard/soft data path that uses DSP blocks operating in fixed-point mode operated in conjunction with general purpose soft logic. The hard/soft data path includes 2-element dot-product circuits that feed an adder tree. Results from the hard data path are combined with the adder tree using format conversion and normalization circuitry. Inputs to the hybrid dot-product circuitry may be in the BFLOAT16 format. The hard data path may be in the single precision format. The hard/soft data path uses a custom format that is similar to but different than BFLOAT16.

20 Claims, 18 Drawing Sheets

(51) Int. Cl.
*H03M 7/24* (2006.01)
*G06F 9/30* (2018.01)
*G06F 17/16* (2006.01)

(58) Field of Classification Search
USPC ............................................................ 708/204
See application file for complete search history.

(56) References Cited

U.S. PATENT DOCUMENTS

| 10,042,607 | B2 | 8/2018 | Langhammer |
| 10,776,078 | B1 * | 9/2020 | Clark .................... G06F 7/4876 |
| 10,970,042 | B2 * | 4/2021 | Langhammer ....... G06N 3/0454 |

OTHER PUBLICATIONS

"IEEE Standard for Floating-Point Arithmetic," IEEE Std 754-2008, pp. 1-58, 29 2008.

"Tensorflow framework, bfloat16 github repository," retreived from; htttps://github.com/tensorflow/tensorflow/blob/master/tensorflow/core/framework/bfloat16.h, accessed: Sep. 25, 2019.

Intel Stratix 10 GX/SX Device Overview, 2018, retrieved from; https://www.intel.com/content/dam/www/programmable/us/en/pdfs/literature/hb/stiatix-10/s10-overview.pdf.

Intel Arria 10 Device Overview, 2018, retrieved from; https://www.intel.com/content/dam/altera-www/global/en_US/?pdfs/literature/hb/arria-10/a10_overview.pdf.

J. Cong and J. Wang, "Polysa: Polyhedral-based systolic array auto-compilation," in Proceedings of the International Conference on Computer-Aided Design, ser. ICCAD '18. New York, NY, USA: ACM, 2018, p. 117:1-117:8.

J. Yinger, E. Nurvitadhi, D. Capalija, A. Ling, D. Marr, S. Krishnan, D. Moss, and S. Subhaschandra, "Customizable FPGA OpenCL matrix multiply design template for deep neural networks," in 2017 International Conference on Field Programmable Technology (ICFPT), Dec. 2017, pp. 259-262.

S. S. Haykin, S. S. Haykin, S. S. Haykin, K. Elektroingenieur, and S. S. Haykin, Neural networks and learning machines. Pearson Upper Saddle River, 2009, vol. 3. Retrieved from: http://repository.fue.edu.eg/xmlui/bitstream/handle/123456789/3421/5618.pdf?sequence=1.

X. Liu, A. Zhang, T. Tiecke, A. Gros, and T. S. Huang, "Feedback neural network for weakly supervised geo-semantic segmentation," CoRR, vol. abs/1612.02766,2016. [Online]. Retrieved from: http://arxiv.org/abs/1612.02766.

M. Ortiz, A. Cristal, E. Ayguade, and M. Casas, "Low-precision floatingpoint schemes for neural network training," CoRR, vol. abs/1804.05267,2018. [Online]. Retrieved from: http://arxiv.org/abs/1804.05267.

C. R. Wan and D. J. Evans, "Nineteen ways of systolic matrix multiplication," International Journal of Computer Mathematics, vol. 68, No. 1-2, pp. 39-69, 1998.

I. Ž. Milovanovi'c, M. P. Bekakos, I. N. Tselepis, and E. I. Milovanovi'c, "Forty-three ways of systolic matrix multiplication," International Journal of Computer Mathematics, vol. 87, No. 6, pp. 1264-1276, 2010.

T. Baozhao, L. Dong, and H. Chengde, "Two-dimensional image processing without transpose," in Proceedings 7th International Conference on Signal Processing, 2004. Proceedings. ICSP'04. 2004., vol. 1. IEEE, 2004, pp. 523-526.

\* cited by examiner

MACHINE LEARNING TRAINING ARCHITECTURE FOR PROGRAMMABLE DEVICES

This application claims the benefit of provisional patent application No. 62/824,797, filed Mar. 27, 2019, which is hereby incorporated by reference herein in its entirety.

BACKGROUND

This invention relates generally to integrated circuits and, in particular, to programmable integrated circuits configured to support machine learning.

Programmable integrated circuits such as programmable logic devices (PLDs) include configurable logic circuitry having look-up tables (LUTs) and adder based logic that are designed to allow a user to customize the circuitry to the user's particular needs. In addition to this configurable logic, PLDs also include programmable interconnect or routing circuitry that is used to connect the inputs and outputs of the configurable logic blocks. The combination of this programmable logic and routing circuitry is referred to as "soft" logic.

Besides soft logic, PLDs may also include specialized processing blocks that implements specific predefined logic functions and thus cannot be configured by the user. Such specialized processing blocks may include a concentration of circuitry on a PLD that has been partly or fully hardwired to perform one or more specific tasks, such as a logical or a mathematical operation. One particularly useful type of specialized processing block that has been provided on PLDs is a digital signal processing (DSP) block. A conventional DSP block includes two 18-by-18 multipliers, which can be combined with other internal circuitry to form a larger 27-by-27 multiplier. The 27-by-27 multiplier is used as part of an IEEE 754 single precision floating-point multiplier, which requires 24 bits of precision.

Recent developments in artificial intelligence such as advancements in machine learning and deep learning involve training and inference, which have necessitated a much higher density of multiplications. In contrast to inference which uses relatively simpler math and dataflow, machine learning training involves more complex large matrix multiplications that require access to external memory. Access to external memory is, however, limited by external memory bandwidth and internal bandwidth management constraints. Using traditional floating-point multipliers to support complex training operations on PLDs may be insufficient. Using too much soft logic in conjunction with the traditional floating-point multipliers to support training also tends to create fitting and timing closure problems.

It is within this context that the embodiments described herein arise.

DETAILED DESCRIPTION

The present embodiments relate to a programmable integrated circuit and in particular, circuitry on a programmable integrated circuit for efficiently supporting machine learning training. It will be recognized by one skilled in the art, that the present exemplary embodiments may be practiced without some or all of these specific details. In other instances, well-known operations have not been described in detail in order not to unnecessarily obscure the present embodiments.

Figure 1:
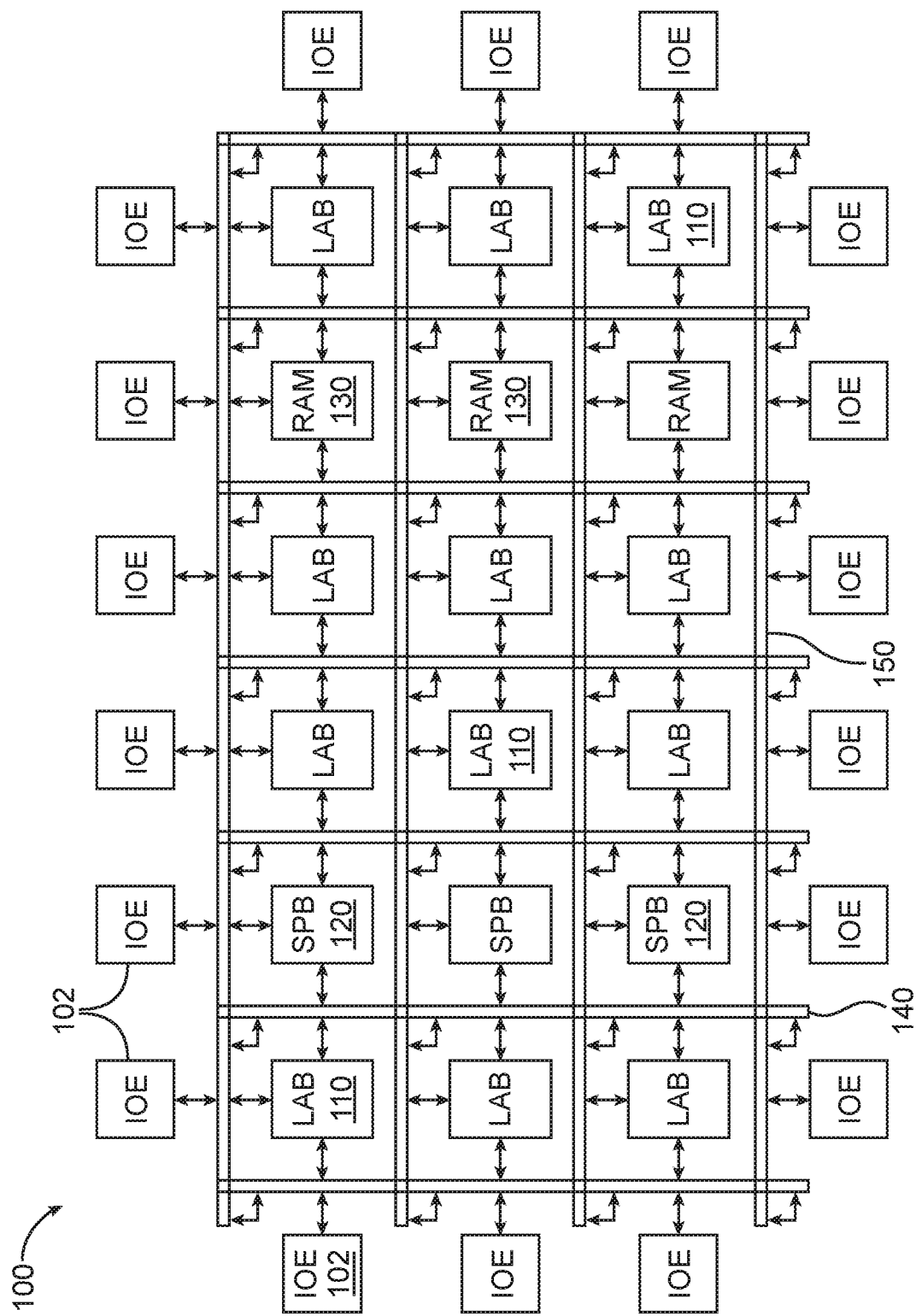
FIG. 1 is a diagram of an illustrative programmable integrated circuit in accordance with an embodiment.

An illustrative embodiment of an integrated circuit such as programmable logic device (PLD) 100 is shown in FIG. 1. As shown in FIG. 1, programmable logic device 100 may include a two-dimensional array of functional blocks, including logic array blocks (LABs) 110 and other functional blocks, such as random access memory (RAM) blocks 130 and specialized processing blocks such as specialized processing blocks (SPB) 120 that are partly or fully hardwired to perform one or more specific tasks such as mathematical/arithmetic operations. Functional blocks such as LABs 110 may include smaller programmable regions (e.g., logic elements, configurable logic blocks, or adaptive logic modules) that receive input signals and perform custom functions on the input signals to produce output signals. Device 100 may further include programmable routing fabric that is used to interconnect LABs 110 with RAM blocks 130 and specialized processing blocks 120 (sometimes referred to as digital signal processing or DSP blocks). The combination of the programmable logic and routing fabric is sometimes referred to as "soft" logic, whereas the DSP blocks are sometimes referred to as "hard" logic (i.e., circuit blocks that can operate independently from and do not rely on soft logic). In general, device 100 may also include other types of hard logic circuitry.

Programmable logic device 100 (e.g., a field-programmable gate array or "FPGA") may contain programmable memory elements for configuring the soft logic. Memory elements may be loaded with configuration data (also called programming data) using input/output elements (IOEs) 102. Once loaded, the memory elements provide corresponding static control signals that control the operation of one or more LABs 110, programmable routing fabric, and optionally SPBs 120 or RAMs 130. In a typical scenario, the outputs of the loaded memory elements are applied to the gates of metal-oxide-semiconductor transistors (e.g., pass transistors) to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), programmable metallization cells (PMCs), conductive-bridging RAM (CBRAM), combinations of these structures, etc. Because the memory elements are loaded with configuration data during programming, the memory elements are sometimes referred to as configuration memory, configuration RAM (CRAM), configuration memory elements, or programmable memory elements.

In addition, programmable logic device 100 may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The routing fabric (sometimes referred to as programmable interconnect circuitry) on PLD 100 may be provided in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, routing wires may be shorter than the entire length of the routing channel. A length L wire may span L functional blocks. For example, a length four wire may span four functional blocks. Length four wires in a horizontal routing channel may be referred to as "H4" wires, whereas length four wires in a vertical routing channel may be referred to as "V4" wires.

Furthermore, it should be understood that the present embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Programmable device 100 may be used to support training neural networks. Training neural networks such as multilayer perceptrons (MLP) is a compute-intensive process that involves repeated forward and backwards operations which include dense matrix multiplications. Due to the numerical properties of the training data such as the requirement to support very small numbers, floating-point representations are often required. As a result, the overall training performance of a MLP neural network is limited by the overall floating-point throughput and also by the memory bandwidth of the underlying compute architecture.

Device configurations in which FPGA 100 is used to support an MLP neural network are sometimes described herein as an example. This is however, merely illustrative. In general, the architecture and associated techniques described herein that improve the ability of device 100 to carry out MLP training may be applied to other types of training and machine learning processes.

Now delving into more detail, a multilayer perception is a neural network having several layers each characterized by a weight matrix. Each layer uses a non-linear activation function (e.g., Rectified Linear Units or "ReLU") and its inverse. The network propagates activation data, grouped into bursts, through all layers, and the learning process determines the required weight changes for each layer. Over several iterations of computation, the network learns weight matrices sensitive to some target function.

The training of such network may involve two passes: (1) a forward pass, where each successive layer performs a matrix multiplication using the current weight matrix and the previous layer's output passed through the activation function; and (2) a backward pass that computes the gradient of the activation data and determines the changes that need to be applied to the weight matrix. The weight update policy may be based on stochastic gradient descent (SGD), as an example. In addition, a bias vector is also learned alongside the weight matrix.

The memory required to store all the weight and activation matrices for multiple layers likely exceeds the on-chip storage capacity available on an FPGA. All matrices may therefore be stored in a row-wise format in an external memory device such as an off-chip double date rate 4 (DDR4) dynamic random-access memory (DRAM) memory attached separately to an FPGA. External DDR memory is typically much more efficient at reading data sequentially (i.e., traversing one matrix direction will work well but not when traversing a different direction). The data should be reordered in such a way so that large sequences of consecutive addresses, which can be grouped into bursts, can be jointly retrieved. Having adequate DDR memory bandwidth can help sustain maximum performance.

Figure 2:
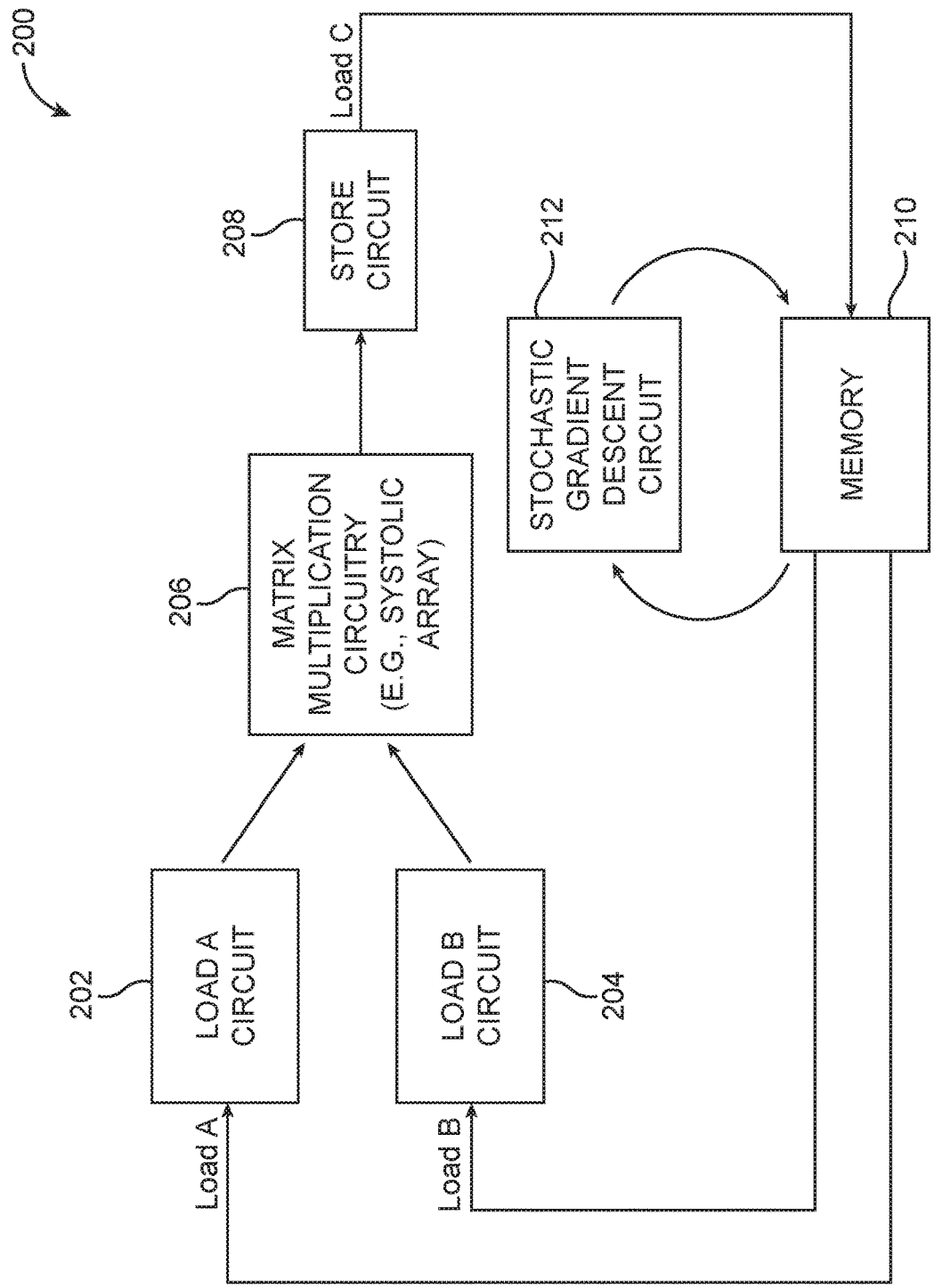
FIG. 2 is a diagram of illustrative machine learning training circuitry in accordance with an embodiment.

FIG. 2 is a diagram of an illustrative machine learning training architecture 200 in accordance with an embodiment. As shown in FIG. 2, training circuitry 200 may include a 3-stage pipeline that reads and writes into off-chip memory 210 (e.g., DDR memory) connected via a ring topology. The first pipeline stage may include a first matrix loading circuit 202 (e.g., a circuit configured to load matrix "A") and a second matrix loading circuit 204 (e.g., a circuit configured to load matrix "B"). The second pipeline stage may include matrix multiplication circuitry 206 implemented using a systolic array (as an example). The third pipeline stage may include a store circuit 208 configured to load a resulting matrix "C" into off-chip memory 210.

Load circuits 202 and 204 may incorporate optional transpositions and activation functions within the pipeline in order to reduce memory traffic. These operations may mutate the multiplication inputs and outputs inline, either prior or after the multiplication at block 206. Stochastic gradient descent may be performed concurrently at circuit 212. If desired, certain operations can be selectively bypassed to allow configuring the pipeline for different training flow equations. Configured in this way, each pipeline stage can operate on a matrix tile using a double buffering scheme to pass the results onto the next pipeline stage. The pipeline is kept occupied by issuing operations on multiple matrix tiles through the pipeline.

Figure 3:
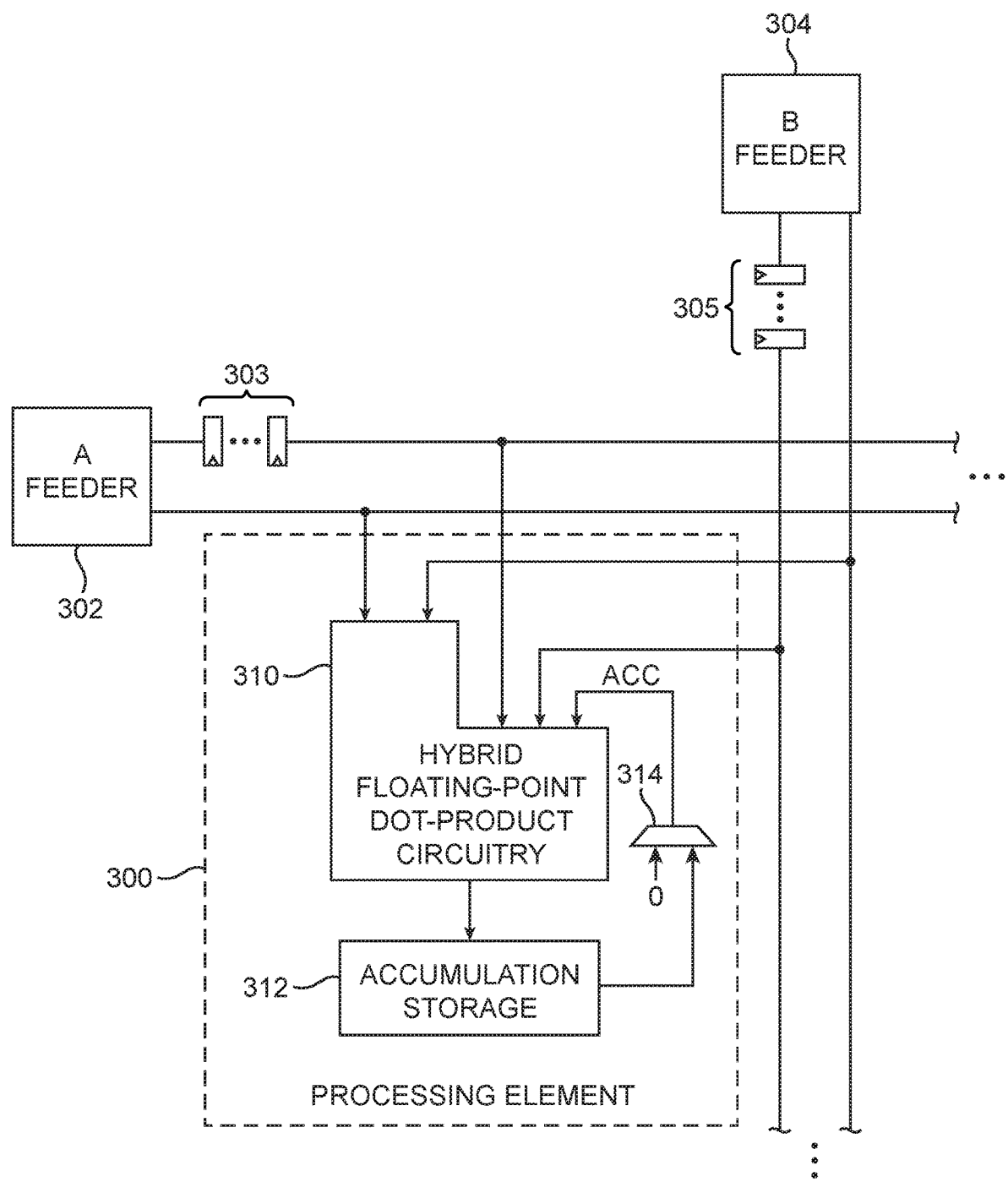
FIG. 3 is a diagram of a systolic array processing element in accordance with an embodiment.

As described above, matrix multiplication may be supported using systolic arrays. Systolic arrays for matrix multiplication include processing elements (PEs) and control logic for coordinating the PEs. FIG. 3 is a diagram of a systolic array processing element 300 in accordance with an embodiment. As shown in FIG. 3, a given row of PEs are loaded with matrix A using row feeder circuit 302, whereas a given column of PEs are loaded with matrix B using column feeder circuit 304. Processing element 300 may include hybrid floating-point dot-product circuitry 310 and also a local accumulation storage circuit 312 (e.g., an accumulation shift register) for temporarily holding intermediate results. Accumulated data may be selectively fed back as inputs to the dot-product circuitry 310 via multiplexer 314 (see accumulated input data ACC). Processing element 300 in the given row and the given column may be configured to interface the computation of the elements it computes to accommodate the propagation latency of the dot product.

Arranged in this way, all PEs in the same row or column of the systolic array can share the same operand. A chip-wide distribution network may be used to provide data to all of the PEs in the systolic array. The matrix A row feeder circuit 302 may receive data originating from load A circuit 202 of FIG. 2, whereas the matrix B column feeder circuit 304 may receive data originating from load B circuit 204. The "hybrid" nature of the floating-point dot-product circuitry 310 stems for the usage of both hard floating-point multipliers (e.g., using DSP blocks) and soft floating-point multipliers. The latency through the soft floating-point multiplier portion will be greater than the latency through the hard floating-point multiplier portion.

This imbalance of arrival times is schematically represented by the L-shaped outline of circuitry 310, where the lower elements corresponding to the soft multiplier inputs are allowed to arrive sooner and where the upper elements corresponding to the hard multiplier inputs have to be delayed to account for the scheduling imbalance. In order to minimize the number of registers that have to be inserted into processing element 300, the input delay is implemented next to the feeder circuitry (e.g., using delay registers 303 at the output of feeder 302 and using delay registers 305 at the output of feeder 304) and preserved along the data bus by ensuring that identical delay increments are added to all bus paths. To ensure that both dot product operands arrive at the same time, the delays introduced by registers 303 along each row and by registers 305 along each column should be matched.

Figure 4:
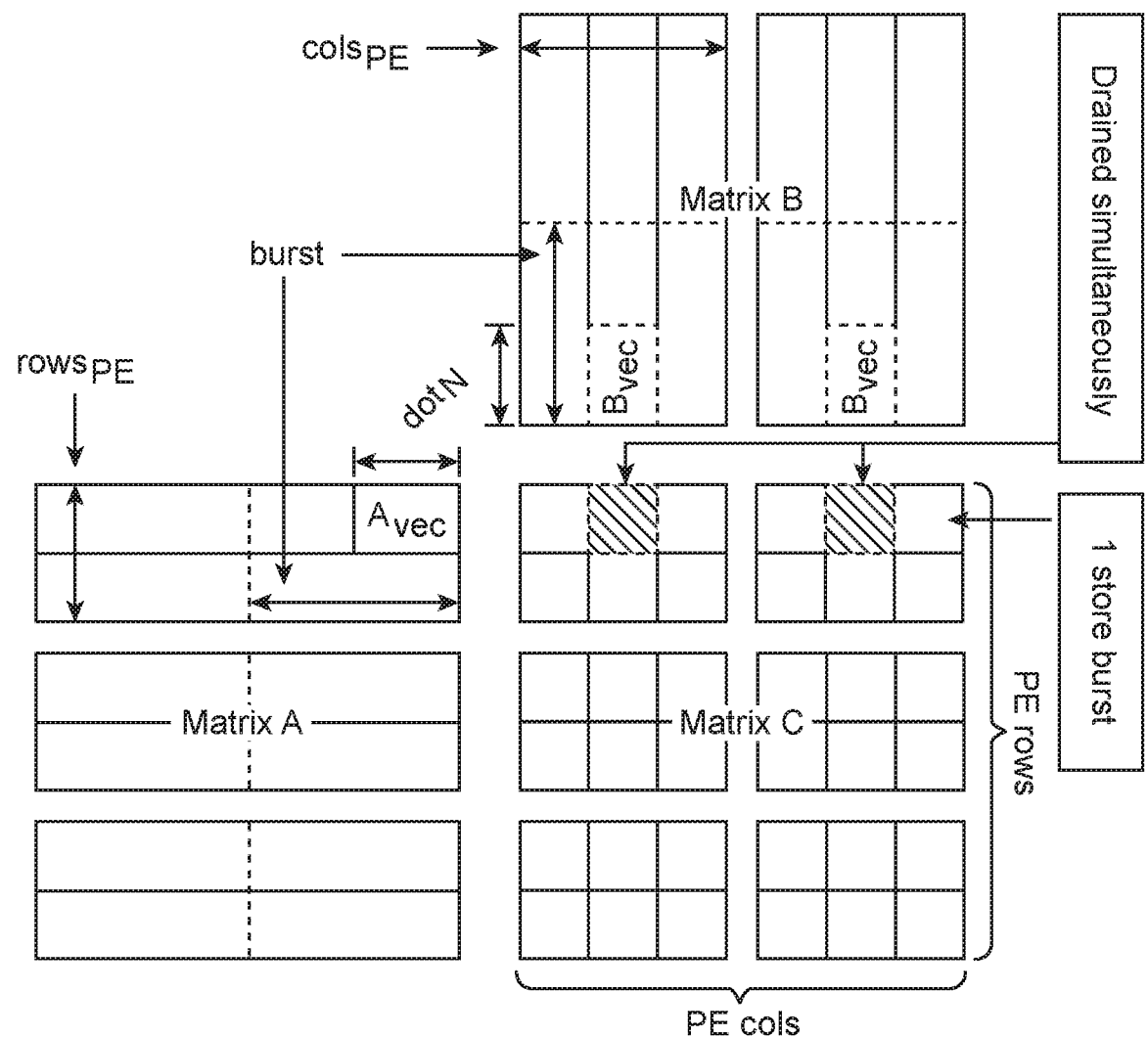
FIG. 4 is a diagram showing an illustrative matrix allocation to an array of processing elements in accordance with an embodiment.

FIG. 4 is a diagram showing an illustrative matrix allocation to a systolic array. As shown in FIG. 4, the storage capacity of the feeder has to accommodate a tile of width burst. This is required to accommodate the smallest unit of off-chip DDR memory access that would utilize the memory bandwidth efficiently. A burst may be several memory words (e.g., 32 bytes, 64 bytes, 128 bytes, 256 bytes, 512 bytes, 1024 bytes, etc.).

The feeder memories should be populated with data words matching the orientation of the dot product operands, which allows the parallel fifth of all input operands every clock cycle. A double buffering scheme may be employed, where one tile is loaded (a process that might take thousands of cycles for each matrix) while the previously loaded tile is broadcast on the row or column bus. By adjusting the number of rows and columns, the degree of data reuse can be modified, and the time it takes to load a new matrix tile into the feeder circuits and the time it takes to issue all row and column permutations in the PE array can be balanced.

The IEEE 754 single precision 32-bit floating-point format has traditionally been used for dot-product data paths. The single precision format has one sign bit, eight exponent bits, and 23 three fraction bits (with an implied leading one bit to make up 24 total mantissa precision). New research, however, seems to suggest that a lower bitwidth floating-point format would be a more suitable candidate for implementing dot-products due to its reduced memory bandwidth requirements, as long as the reduction tree is implemented in single precision. For example, a 16-bit format (sometimes referred to as "BFLOAT16") having one sign bit, eight exponent bits (i.e., wE=8), and seven fraction bits (i.e., wF=7) might be used. The reduced 16-bit operands in BFLOAT16 allows for a potential 2× memory bandwidth improvement.

Conventional FPGA designs are, however, heavily optimized for single precision (SP) arithmetic. For instance, single precision dot-product circuit blocks typically map directly to DSP blocks running at nominal frequencies. Thus, obtaining a higher than SP dot-product density for a BFLOAT16+SP dot-product is challenging. First, BFLOAT16 multipliers require a combination of DSP blocks and adaptive logic modules (ALM) within LABs 110 (FIG. 1) to implement. In order to obtain better dot-product density than by just using DSP blocks, a custom floating-point pipeline architecture is provided.

Figure 5A:
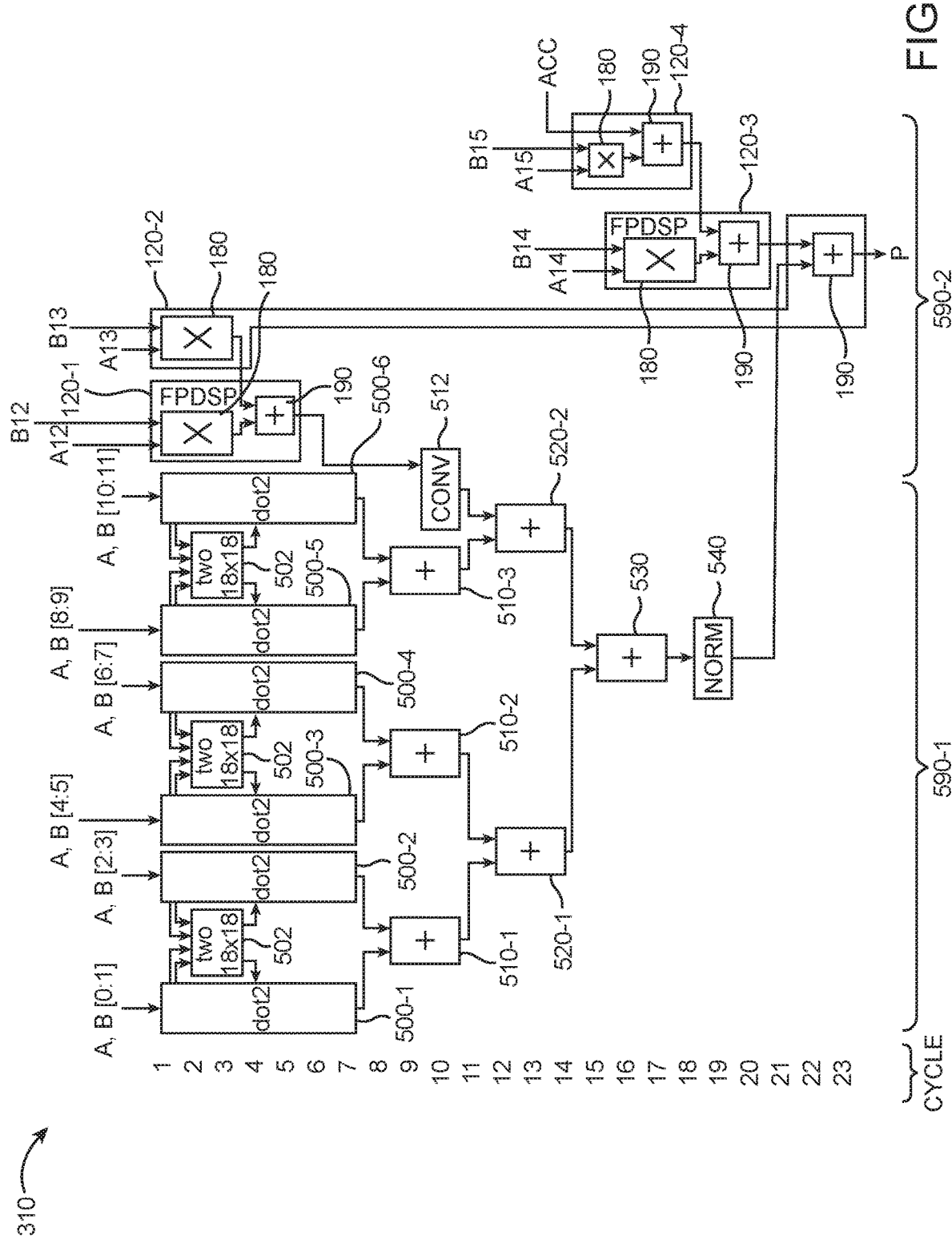
FIG. 5A is a diagram of illustrative hybrid floating-point 16-element dot-product circuitry in accordance with an embodiment.

In accordance with an embodiment, hybrid floating-point dot-product circuitry 310 that utilizes both hard DSP blocks and custom soft multiplier blocks is shown in FIG. 5A. This exemplary hybrid dot-product architecture 310 is configured to implement a 16-element dot-product. As shown in FIG. 5A, circuitry 310 may receive input operands $A_i, B_i$ both of which are in BFLOAT16 format, where i represents an index from 0 to 15. The rightmost accumulate (ACC) input may be in the single precision format.

Figure 5B:
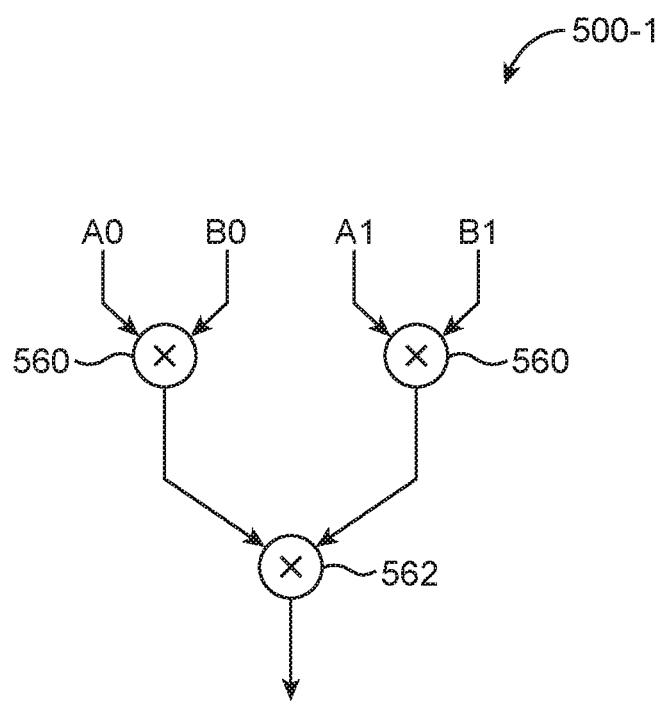
FIG. 5B is a diagram of an illustrative 2-element dot-product circuit in accordance with an embodiment.

The first 12 sets of input operands feed into six custom 2-element dot-product circuits 500. Each circuit 500 may be configured to generate a sum of two products and is sometimes referred to herein as a "dot2" circuit. In the example of FIG. 5A, circuit 500-1 may be configured to compute (A0*B0+A1*B1); circuit 500-2 may be configured to compute (A2*B2+A3*B3); circuit 500-3 may be configured to compute (A4*B4+A5*B5); . . . ; and circuit 500-6 may be configured to compute (A10*B10+A11*B11). An example of an individual dot2 circuit 500-1 is shown in FIG. 5B. As shown in FIG. 5B, dot2 circuit 500-1 includes a first multiplier 560 for computing A0*B0, a second multiplier 560 for computing A1*B1, and an adder for summing the results from the two multiplier 560. Referring back to FIG. 5A, the outputs from the various dot2 circuits 500 may be fed into an adder tree, which may include a first stage of adders 510-1, 510-2, 510-3, a second stage of adders 520-1 and 520-2, and a third adder stage 530.

A DSP block within an FPGA may be operated either in a floating-point mode or a fixed-point mode. In the fixed-point mode, the DSP block may be configured so that two 18×18 multipliers operate independently or configured into one larger 27×27 multiplier. The "hybrid" labeling of architecture 310 is due to the usage of both a "hard" data path (e.g., where the DSP blocks corresponding to the higher inputs A,B[12:15] are configured to operate in the floating-point mode) and a "soft" data path (e.g., where the DSP blocks corresponding to the lower inputs A,B[0:11] are configured to operate in the fixed-point mode in order to access the two 18×18 multipliers 502 independently).

As shown in FIG. 5A, one of the two 18×18 multipliers 502 may be used by circuit 500-1, whereas the second of the two 18×18 multipliers may be used by circuit 500-2. Each 18×18 multiplier may be further used to support two smaller 8×8 multiplications performed by multipliers 560 (see, e.g., FIG. 5B). From a resource utilization perspective, each dot2 circuit 500 uses half a DSP block and some general purpose soft logic, which may include various operations such as exponent add, exponent difference, integer add, alignment shifting, etc. A single 18×18 multiplier may only natively support two 6×6 multiplications, so additional soft logic is needed to support two 8×8 multiplications for BFLOAT16. Thus, each dot2 circuit 500 may also be considered a "hybrid" circuit since it uses a DSP block in fixed-point mode with soft logic to extend the support to BFLOAT16. Portion 590-1 of circuitry 310 that includes the dot2 circuits therefore corresponds to a hard and soft data path, whereas portion 590-2 of circuitry 310 that includes the DSP blocks operating in floating-point mode may therefore correspond to the hard data path.

The next two sets of input operands A,B[12:13] may be computed in parallel using two DSP blocks 120-1 and 120-2 configured in the floating-point mode. The conversion from the BFLOAT16 input format to the single precision floating-point format can be done by zero padding BFLOAT16's 7-bit mantissa. The output of DSP block 120-1 may merge into the adder tree via conversion circuit 512, and the result at the final stage of the adder tree may be normalized into an IEEE 754-like format. The remaining input operands may be computed using DSP blocks 120-3 and 120-4 also configured in the floating-point mode. Blocks 120-3 and 120-4 may collectively compute (A14*B14+(A15*B15+ACC)). The single-precision adder circuit 190 within DSP block 120-2 may be used to compute the final addition between the normalized result from the adder tree and the output from blocks 120-3 to calculate final output (A0*B0+A1*B1+ A2*B2+ . . . +A14*B14+A15*B15+ACC).

The labeling on the left edge of FIG. 5A illustrates when the inputs associated with the different elements should be scheduled for arrival. Inputs A,B[0:13] can be scheduled to arrive in parallel at cycle #1. However, inputs A,B[14:15] should be delayed so that they arrive later after cycle #14. This input scheduling imbalance again lends to the L-shaped logical representation of FIG. 3.

Figure 6A:
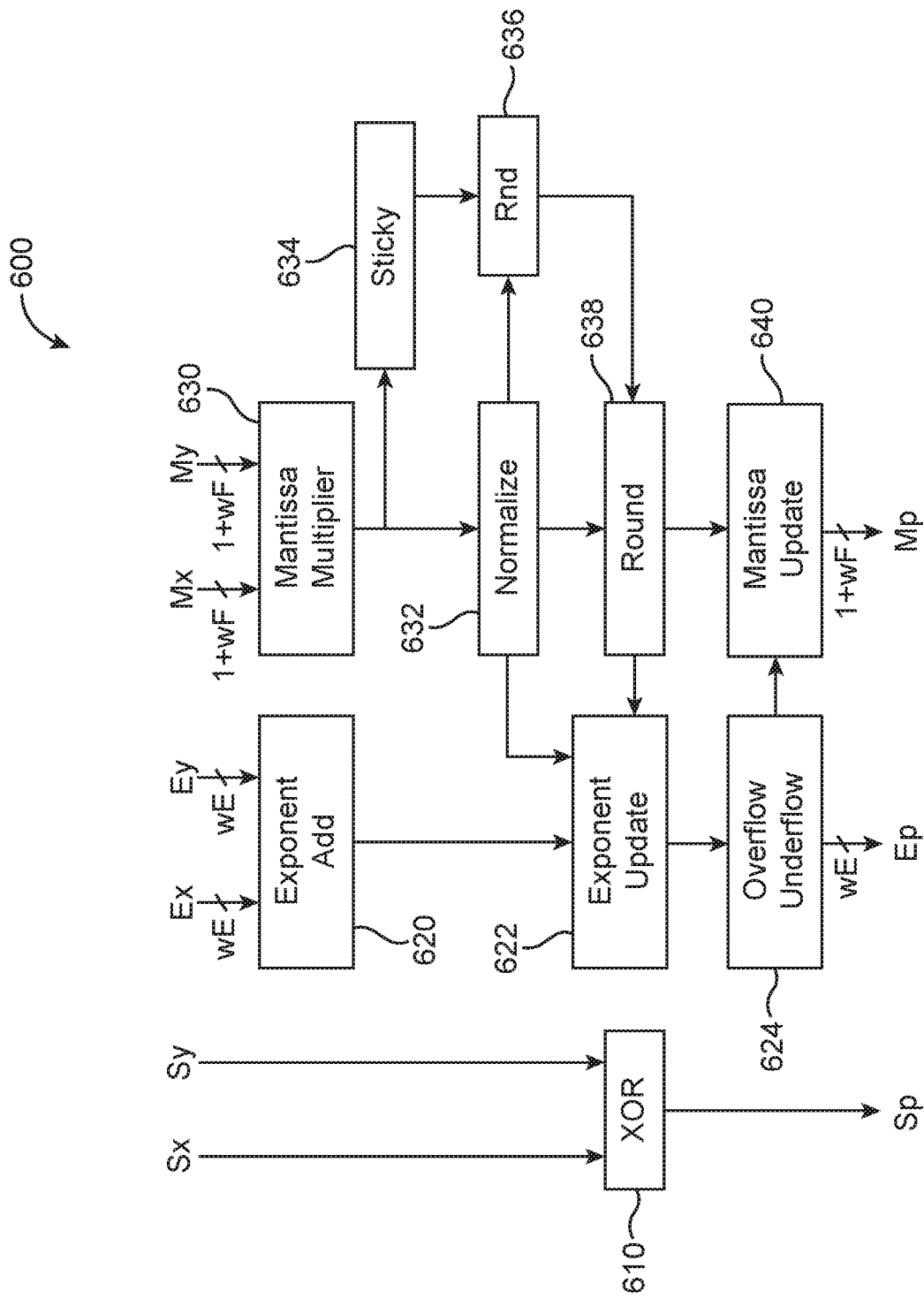
FIG. 6A is a diagram of a classical floating-point multiplier.

FIG. 6A is a diagram of a classical floating-point multiplier 600. The multiplier blocks 180 within the DSP blocks 120 in FIG. 5A may optionally be implemented using this classical multiplier architecture. Multiplier 600 is configured to receive a first floating-point input X having a sign bit Sx, an exponent Ex, and a mantissa Mx and a second floating-point input Y having a sign bit Sy, an exponent Ey, and a mantissa My. Exponents Ex and Ey have the same exponent width wE. Mantissas Mx and My have a precision that is equal to (1+wF) if accounting for the implied leading one bit in front of the radix point.

Multiplier 600 includes a logic XOR gate 610 that receives sign bits Sx and Sy and generates a corresponding output sign bit Sp for the resulting product. Multiplier 600 further includes a mantissa multiplier block 630, a mantissa normalization block 632, a mantissa sticky bit block 634, a round bit computing block 636, a mantissa rounding block 638, and a mantissa update block 640 for handling the mantissa of the resulting product. Mantissa multiplier block 630 multiplies Mx by My to obtain a mantissa product, which has up to (2+2*wF) bits.

Block 632 receives the top (2+wF+1) bits of the mantissa product and normalizes this value to the interval [1,2) by checking the most significant bit (MSB) of the mantissa product. If the MSB is equal to "1", then block 632 performs a 1-position right shift. This MSB bit is also forwarded to the exponent update block 622. The bit shifted out during the 1-position right shift is forwarded to the Rnd block 636 together with the two least significant bits (LSBs) of the normalized mantissa product.

Block 634 computes sticky bits from the bottom (wF−1) bits of the mantissa product. The sticky bit is the logic OR'ed result of all of these bottom bits. Thus, if any of the (wF−1) bits are high, then the output of the sticky bit block 634 will be equal to "1". The Rnd block 636 receives a partial sticky value from block 634 and the shifted-out value from block 632 to product a final sticky value. The additional two LSBs forwarded from block 632 represent the mantissa LSB (i.e., T) and a rounding bit (R). Bits T, R, and the final sticky value are used collectively to produce a 1-bit "Rnd" signal that will be added to the LSB of the normalized mantissa at rounding block 638. Rounding block 638 is composed of one integer adder for adding the Rnd value computed by block 636 to the normalized fraction. This adder has wF bits and produces a carry-out signal, which is passed to the exponent update block 622.

Mantissa update block 640 receives the overflow and underflow signals from block 624 and flushes the mantissa to zero if either an overflow or underflow has occurred. This is required since IEEE 754 has specific encodings for infinity and zero. The resulting final mantissa value Mp will have (1+wF) bits.

Multiplier 600 further includes an exponent addition circuit 620 for summing exponents Ex and Ey. Block 622 increments the sum of the exponents when (i) the product of the mantissa product is greater than or equal to two or (ii) when the resulting mantissa after rounding is greater than or equal to two. Block 624 checks that the final exponent is within the allowed bounds. For single precision and BFLOAT16, the maximum exponent is equal to 127 while the minimum exponent is equal to −126 since both formats use 8 exponent bits. If the exponent value is greater than 127, then the multiplier should return infinity (i.e., by returning a string of wE ones "11111111"). If the exponent value is less than −126, then the multiplier should return zero (i.e., by returning a string of wE zeros "00000000").

Configured in this way, multiplier 600 performs a mantissa multiplication (at block 630), 1-bit normalization (at block 632), rounding (using blocks 634, 636, and 638) and overflow/underflow followed by exception handling.

Figure 6B:
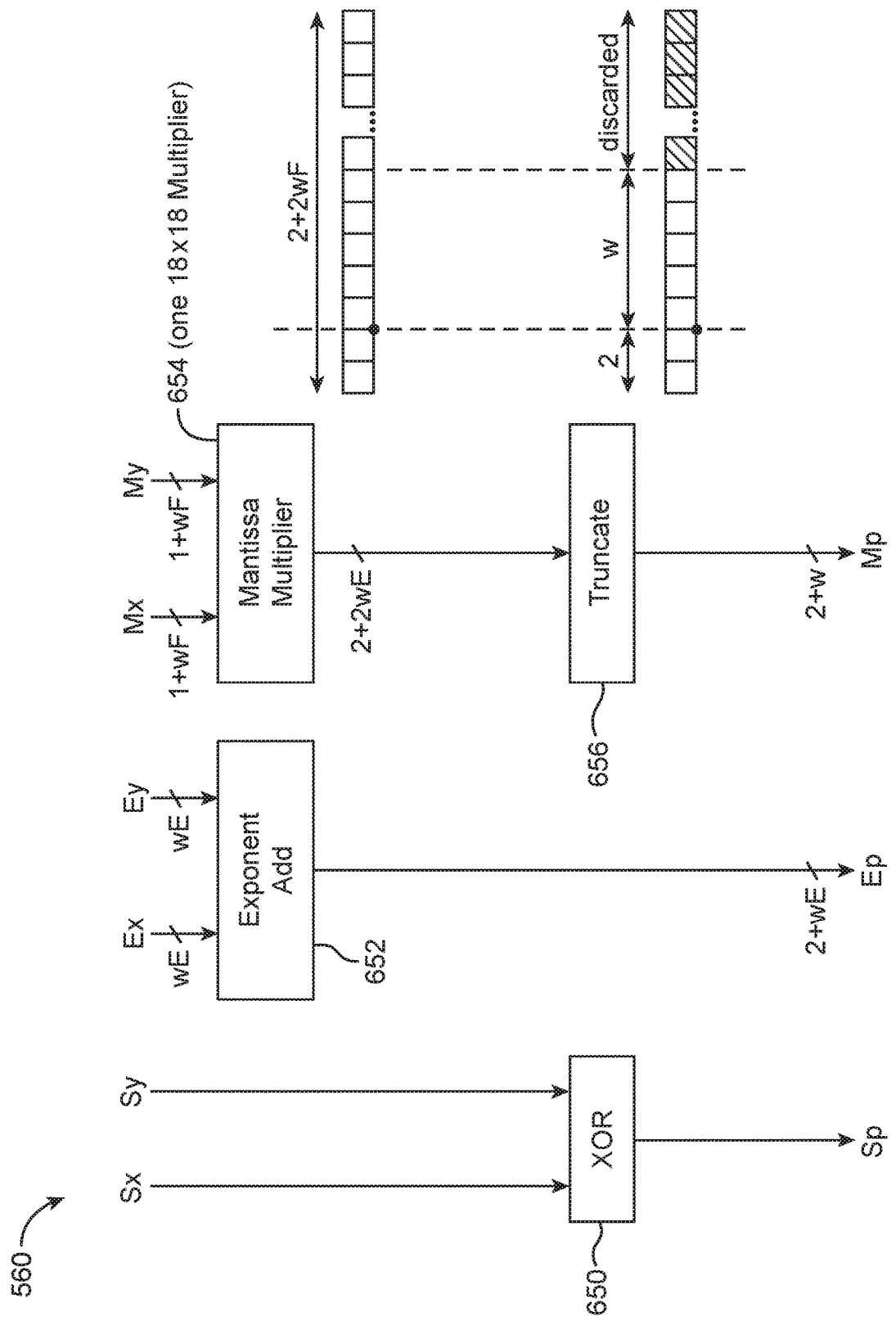
FIG. 6B is a diagram of an illustrative customized floating-point multiplier within the 2-element dot-product circuit shown in FIG. 5B in accordance with an embodiment.

FIG. 6B is a diagram of an illustrative customized floating-point multiplier 560 within the 2-element dot-product circuit shown in FIG. 5B in accordance with an embodiment. As shown in FIG. 6B, multiplier 560 may only include logic XOR gate 650 for computing the sign bit, an exponent adder circuit 652, a mantissa multiplier circuit 654 (which can be implemented using only one 18×18 multiplier within a DSP block), and a bit truncating circuit 656.

In contrast to the classical multiplier shown in FIG. 6A, custom multiplier 560 skips the normalization stage (but requires an extra overflow guard bit) and skips the rounding stage (but requires an additional mantissa bit). All (2+2wF) bits, which includes the additional mantissa bit, are then fed to truncate block 656. Truncate block 656 will then truncate or discard all bits beyond the (2+w) most significant bits. The parameter "w" might be set equal to 8 (as an example) or some other value (e.g., w may be set equal to 6, 7, 9, 10, 5-12, 4-16, or some other suitable integer value) that can be adjusted to trade off resource for accuracy. Multiplier 560 also skips the overflow/underflow and exception handling by extending the exponent by 2 bits to include one sign bit and one overflow guard bit (e.g., the final exponent will have (2+wE) bits).

Compared to multiplier 600 of FIG. 6A, multiplier 560 of FIG. 6B provides significant area and power savings while offering comparable accuracy for the overall dot-product circuitry, which provides a tangible improvement to the underlying computer functionality when supporting machine learning processes.

Figure 7A:
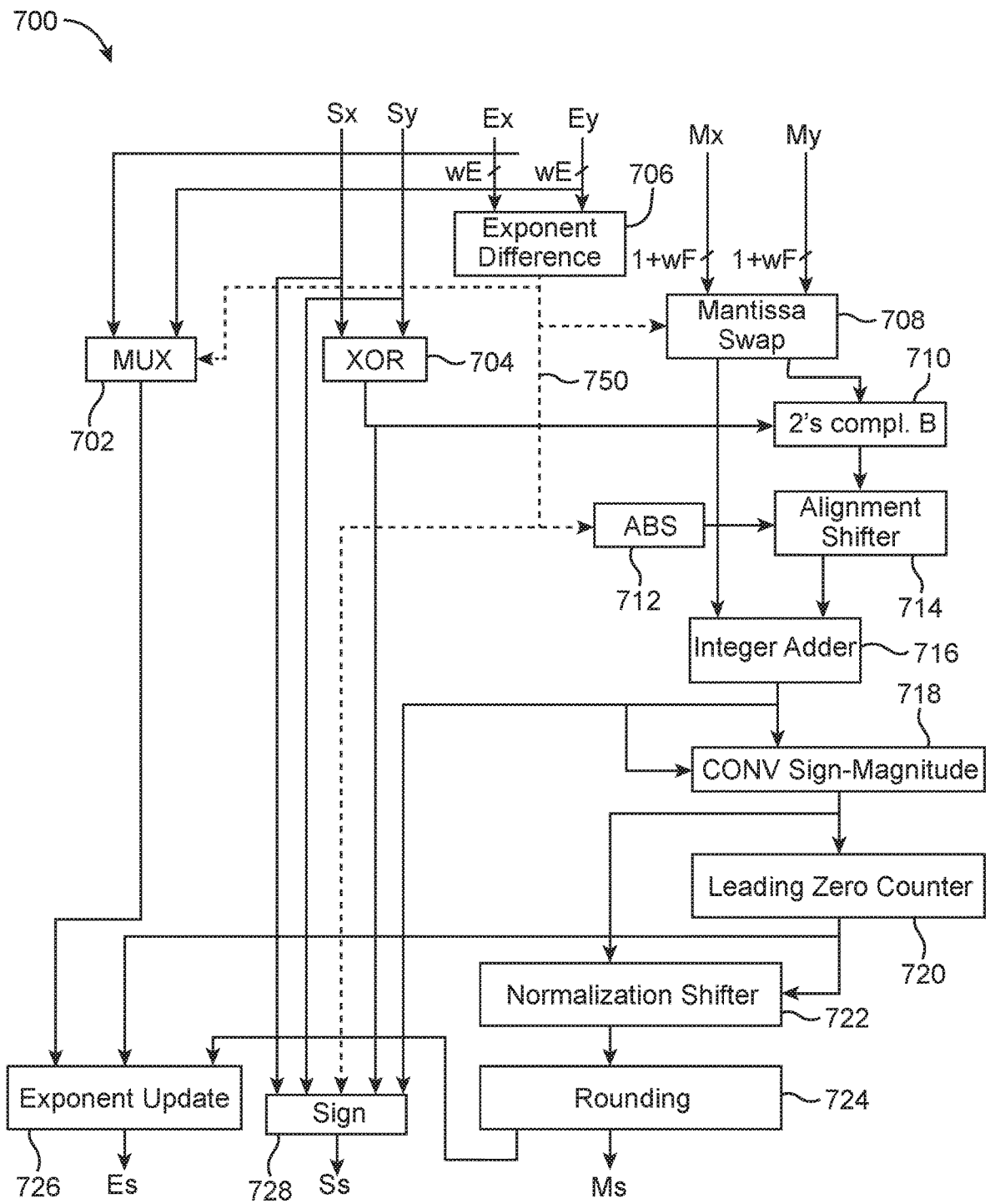
FIG. 7A is a diagram of a classical floating-point adder.

FIG. 7A is a diagram of a classical floating-point adder 700. The adder blocks 190 within the DSP blocks 120 in FIG. 5A may optionally be implemented using this classical adder architecture. Adder 700 is configured to receive a first floating-point input X having a sign bit Sx, an exponent Ex, and a mantissa Mx and a second floating-point input Y having a sign bit Sy, an exponent Ey, and a mantissa My. Exponents Ex and Ey have the same exponent width wE. Mantissas Mx and My have a precision that is equal to (1+wF) if accounting for the implied leading one bit in front of the radix point.

Adder 700 includes a multiplexer 702, a logic XOR gate 704, an exponent difference block 706, a mantissa swap block 708, a two's complement block 710, an absolute value (ABS) block 712, an alignment shifter 714, an integer adder block 716, a sign-magnitude conversion block 718, a leading zero counter 720, a normalization shifter 722, a rounding block 724, an exponent update block 726, and a sign block 728. Logic XOR gate 704 simply computes the exclusive OR of Sx and Sy.

Block 706 computes the difference of Ex minus Ey. Multiplexer 702 outputs the maximum of the two exponents Ex and Ey. The select line of multiplexer 702 is driven by the sign bit (i.e., the MSB) of the difference of (Ex−Ey) computed by block 706. If the difference is negative (i.e., if the sign bit of Ex−Ey is "1"), then multiplexer 702 will forward Ey; otherwise, it will output Ex.

Mantissa swap block 708 selectively swaps the mantissas depending on whether the difference computed by block 706 is negative (i.e., a swap is required if Ex is smaller than Ey). The mantissa value corresponding to the smaller exponent will be converted to the two's complement using block 710 if the output of XOR block 704 is high (i.e., if the signs of X and Y are different). Block 712 calculates the absolute value of the exponent difference. For example, if the exponent difference is equal to −2, then the mantissa corresponding to the smaller exponent needs to be shifted by two bit positions using alignment shifter 714 with respect to the mantissa corresponding to the larger exponent.

The mantissa corresponding to the larger exponent and the mantissa corresponding to the smaller exponent, after being aligned by shifter 714, are then summed together by integer adder 716. The output of adder 716 is then converted to sign-magnitude format using block 718. Leading zero counter 720 determines the number of leading zeros in the converted sign-magnitude value. Normalization shifter 722 then normalizes the sign-magnitude value by shifting that value left based on the number of leading zeros determined by counter 720. This normalized mantissa may then be rounded by block 724 to output the final mantissa of the sum (Ms).

Sign block 728 may output the final sign bit of the sum (Ss) based on Sx, Sy, the output of XOR gate 704, the exponent difference, and also the output of integer adder 716. Exponent update block 726 receives the larger exponent value from block 702, the leading zero count value from block 720, and also the carry-out bit from rounding block 724. If the carry-out of rounding block 724 is a "1", then the larger exponent received at block 726 from multiplexer 702 will be incremented by one. Otherwise, if the leading zero count is "0" (indicating that the sum of the two mantissas is greater than or equal to two), then the received exponent will be decremented by one. If the leading zero count is "1", then the received exponent is not updated. If the leading zero count is c, where c is greater than one, then the value (c−1) will be subtracted from the received exponent to generate final exponent Es. For simplicity, the overflow/underflow block that checks the bounds of the exponents is omitted from FIG. 7A.

Figure 7B:
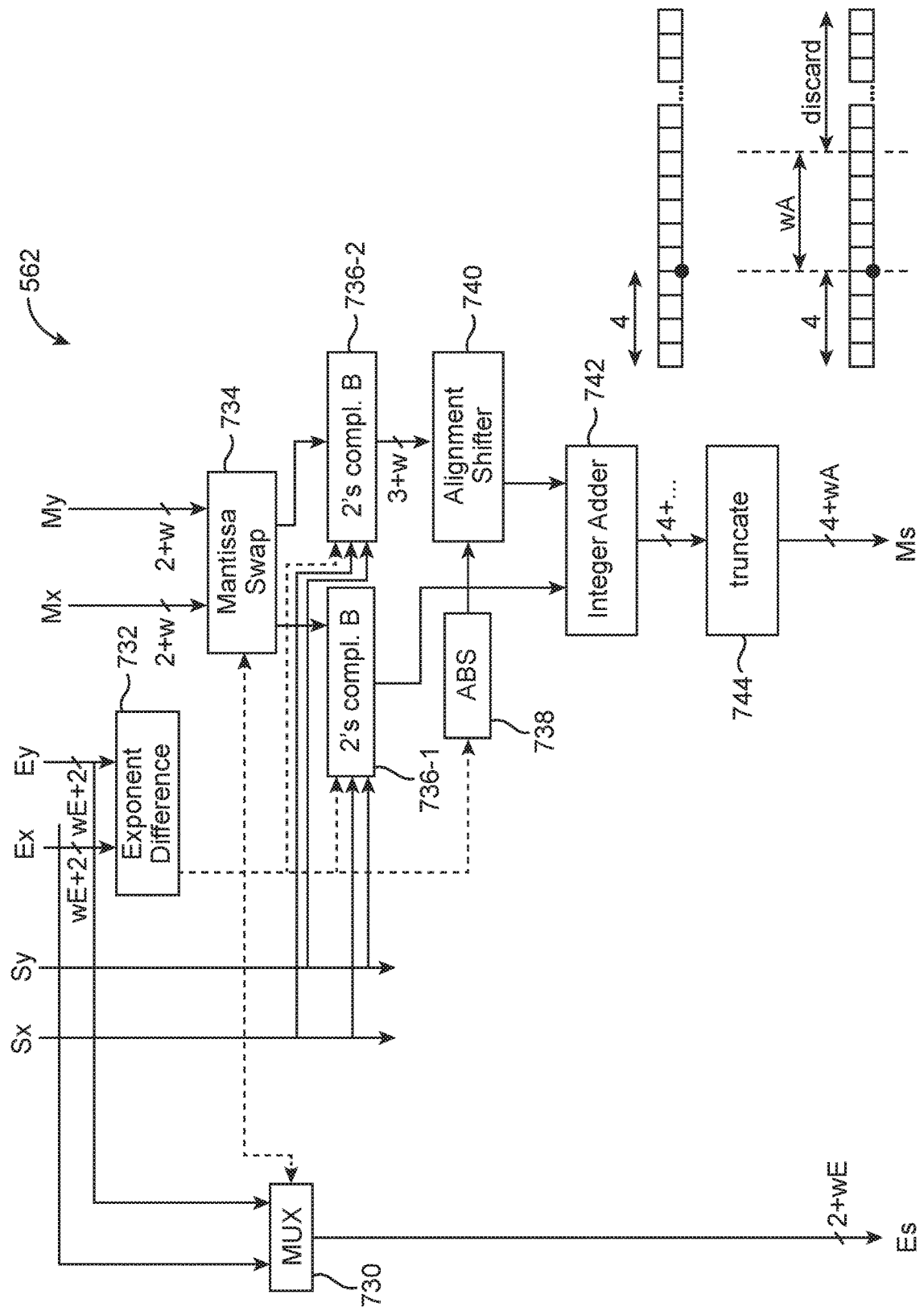
FIG. 7B is a diagram of an illustrative floating-point adder within the 2-element dot-product circuit shown in FIG. 5B in accordance with an embodiment.

FIG. 7B is a diagram of an illustrative customized floating-point adder 562 within the 2-element dot-product circuit shown in FIG. 5B in accordance with an embodiment. Floating-point adder 562 may therefore sometimes be referred to as the dot-2 adder. As shown in FIG. 7B, adder 562 may only include multiplexer 730, exponent difference circuit 732, mantissa swap circuit 734, a first two's complement circuit 736-1, a second two's complement circuit 736-2, an absolute value (ABS) circuit 738, an alignment shifter circuit 740, an integer adder 742, and a truncation circuit 744.

In contrast to the classical adder shown in FIG. 7A, custom adder 562 receives products in a customized format from the output of multiplier 560 shown in FIG. 6B. As described above in connection with FIG. 6B, each of the arriving product signal may have a 1-bit sign field, an exponent field represented by (2+wE) bits, and an un-normalized mantissa field that requires (2+w) bits. Adder 562 is "custom" in the sense that it operates on this non-standard input format.

Circuits 736-1 and 736-2 converts the un-normalized mantissas into their two's complement equivalent. After alignment by shifter 740, the fixed-point sum of the two mantissas is computed at block 742. The right shifter 740 is less costly compared to alignment shifter 714 for circuit 700 since it does not need to compute the sticky bits typically required for rounding. The rounding-to-nearest step is also skipped and is replaced by truncation block 744 which truncates the fractional portion to wA bits and discards all bits beyond the wA positions to the right of the radix point. Adjustable parameter wA therefore dictates the position of the truncation. The parameter "wA" might be set equal to 8 (as an example) or some other value (e.g., wA may be set equal to 6, 7, 9, 10, 5-12, 4-16, or some other suitable integer value) that can be adjusted to trade off resource utilization for accuracy. Adder 562 itself may output signals in yet another custom format composed of an exponent field Es with (2+wE) bits and a mantissa field Ms with (4+wA) bits. The resulting mantissa Ms will be in the two's complement format, so no extra sign bit is required at the output of adder 562.

Compared to adder 700 of FIG. 7A, custom adder 562 of FIG. 7B provides significant area and power savings while offering comparable accuracy for the overall dot-product circuitry, which provides a tangible improvement to the underlying computer functionality when supporting machine learning processes. Custom adder 562 provides these improvements by directly outputting the exponent of the sum without an exponent update circuit, by generating the mantissa of the sum without a sign-magnitude converter, without a leading zero counter, without a normalization shifter, and without a rounding circuit.

Figure 7C:
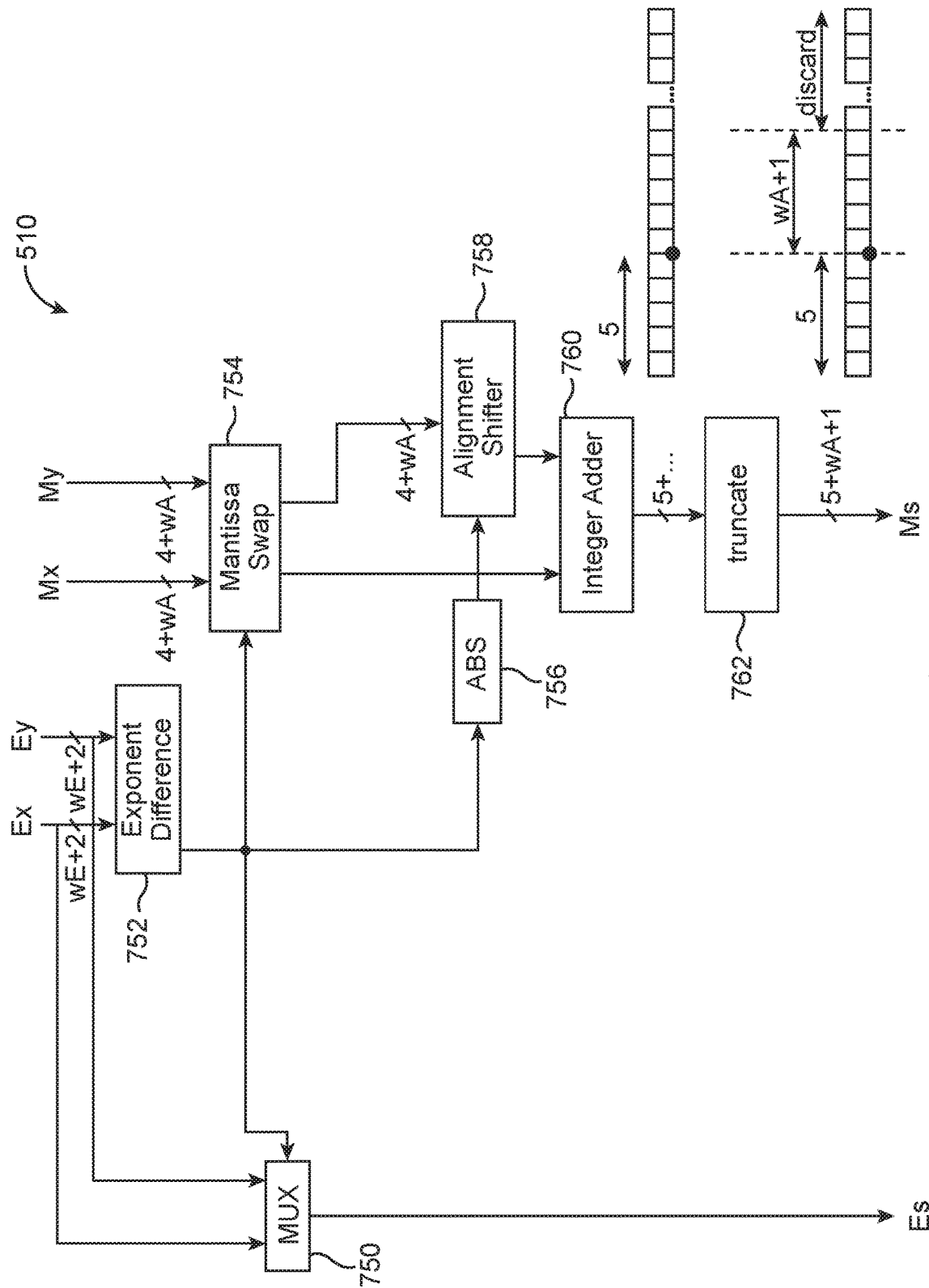
FIG. 7C is a diagram of an illustrative customized floating-point adder in a first adder stage of the hybrid floating-point dot-product circuitry of FIG. 5A in accordance with an embodiment.
Figure 7D:
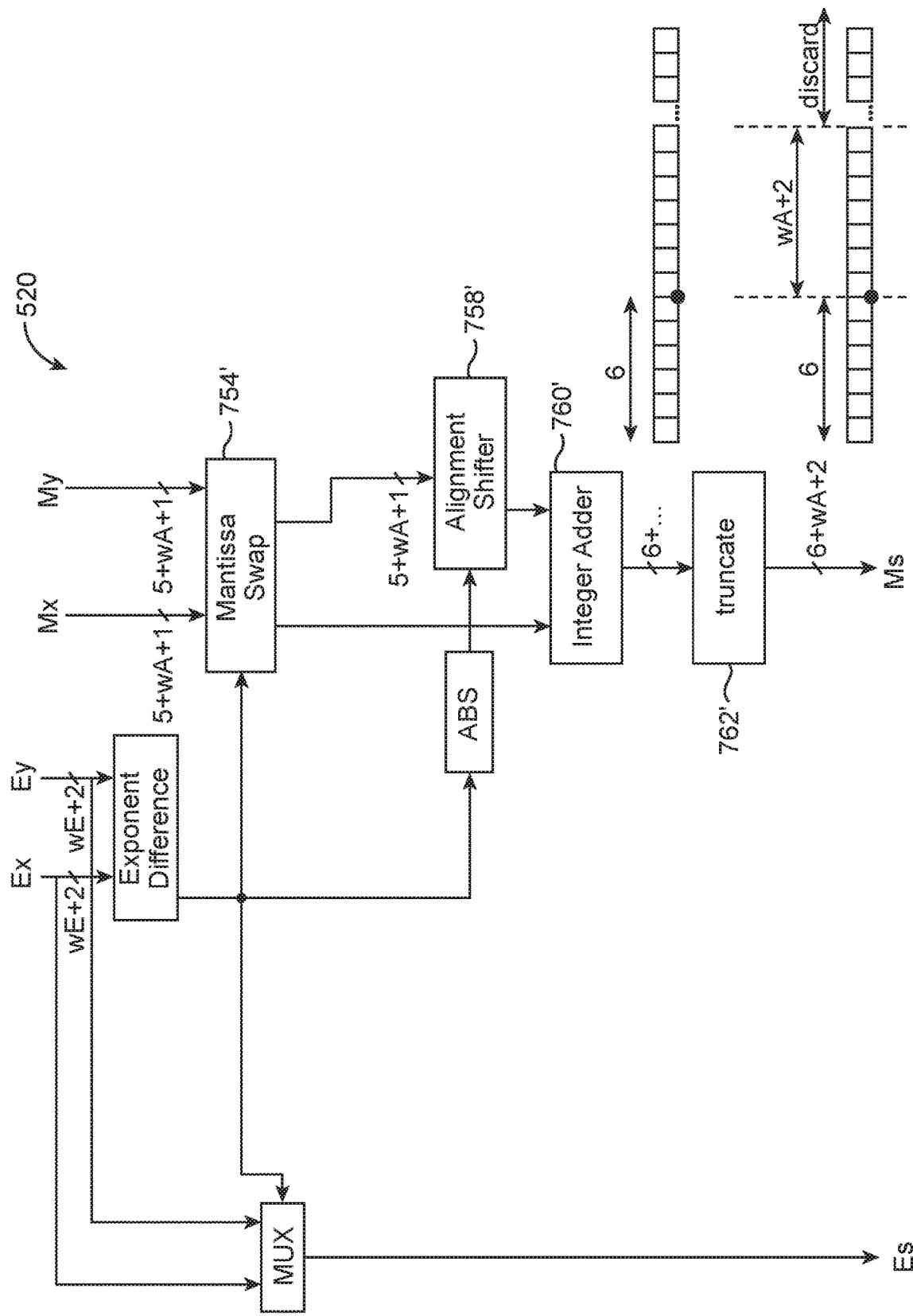
FIG. 7D is a diagram of an illustrative customized floating-point adder in a second adder stage of the hybrid floating-point dot-product circuitry of FIG. 5A in accordance with an embodiment.
Figure 7E:
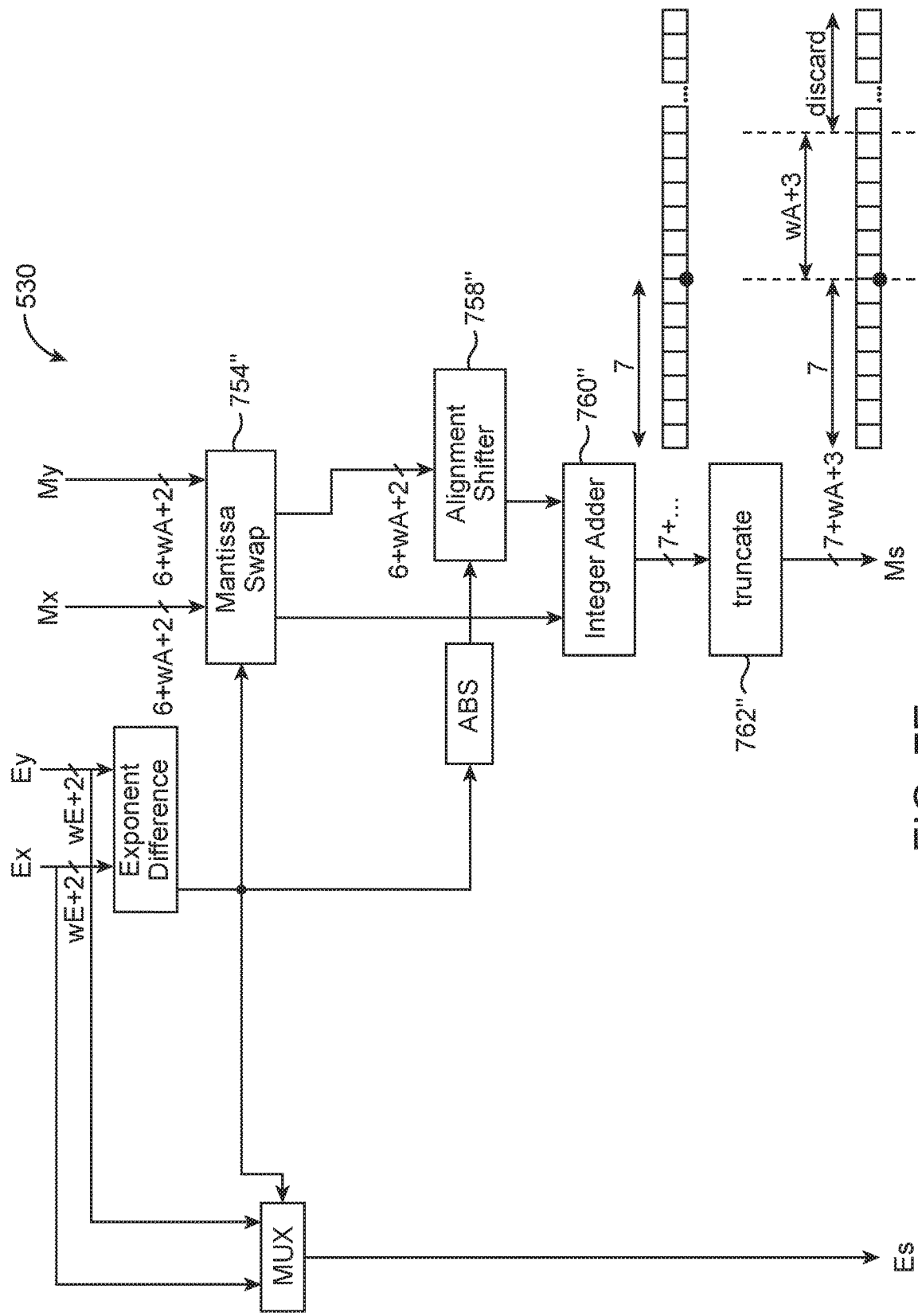
FIG. 7E is a diagram of an illustrative customized floating-point adder in a third adder stage of the hybrid floating-point dot-product circuitry of FIG. 5A in accordance with an embodiment.

FIGS. 7C, 7D, and 7E illustrate suitable implementations for the custom floating-point adders in the adder tree (see, e.g., adders 510, 520, and 530 in FIG. 5A). The adders in the adder tree are "customized" in the sense that they are configured to receive inputs having the custom numerical format output by adder 562 of FIG. 7B.

FIG. 7C is a diagram of customized floating-point adder 510 in the first adder stage of hybrid floating-point dot-product circuitry 310 (see, e.g., adders 510-1, 510-2, and 510-3 in FIG. 5A). As shown in FIG. 7C, adder 510 may include a multiplexer 750 (having similar structure and function as multiplexer 730 of FIG. 7B), an exponent difference circuit 752 (having similar structure and function as block 732), mantissa swapping circuit 754 (having similar structure and function as block 734), absolute value circuit 756 (having similar structure and function as block 738), alignment shifting circuit 758 (having similar structure and function as block 740), integer adder 760 (corresponding to adder block 742), and truncation circuit 762 (corresponding to block 744).

Compared to the dot-2 adder 562, adder 510 is less complex since the conversion from the sign-magnitude to the two's complement is no longer required (i.e., adder 562 does not include any two's complement converter). Note that the output of integer adder 760 has 5 bits in front of the radix point, with the extra one MSB to prevent overflow. After truncation at block 762, the resulting mantissa will have (5+wA+1) bits, with another extra LSB to optionally improve accuracy with the truncation. In other words, the mantissa width may increase by two bits at the first adder level.

FIG. 7D is a diagram of customized floating-point adder 520 in the second adder stage of hybrid floating-point dot-product circuitry 310 (see, e.g., adders 520-1 and 520-2 in FIG. 5A). Adder 520 has a substantially similar structure as adder 510, except the mantissa swap circuit 754' and the mantissa alignment shifter 758' now operates on (5+wA+1) bits. The output of integer adder 760' now has 6 bits in front of the radix point, with the another extra MSB to prevent overflow. After truncation at block 762', the resulting mantissa will have (6+wA+2) bits, with another extra LSB to optionally improve accuracy with the truncation. In other words, the mantissa width may increase by another two bits at the second adder level.

FIG. 7E is a diagram of customized floating-point adder 530 in the third adder stage of hybrid floating-point dot-product circuitry 310 (see, e.g., adder 530 in FIG. 5A). Adder 530 has a substantially similar structure as adders 510 and 520, except the mantissa swap circuit 754'' and the mantissa alignment shifter 758'' now operates on (6+wA+2) bits. The output of integer adder 760'' will now have 7 bits in front of the radix point, with the additional MSB to prevent overflow. After truncation at block 762'', the resulting mantissa will have (7+wA+3) bits, with another extra LSB to optionally improve accuracy with the truncation. In other words, the mantissa width may increase by yet another two bits at the third adder level.

Referring briefly back to FIG. 5A, the output of DSP block 120-1 is in the single precision format and needs to be converted to the custom format using conversion circuit 512 prior to being merged with adder 520-2 at the second level of the adder tree.

Figure 8:
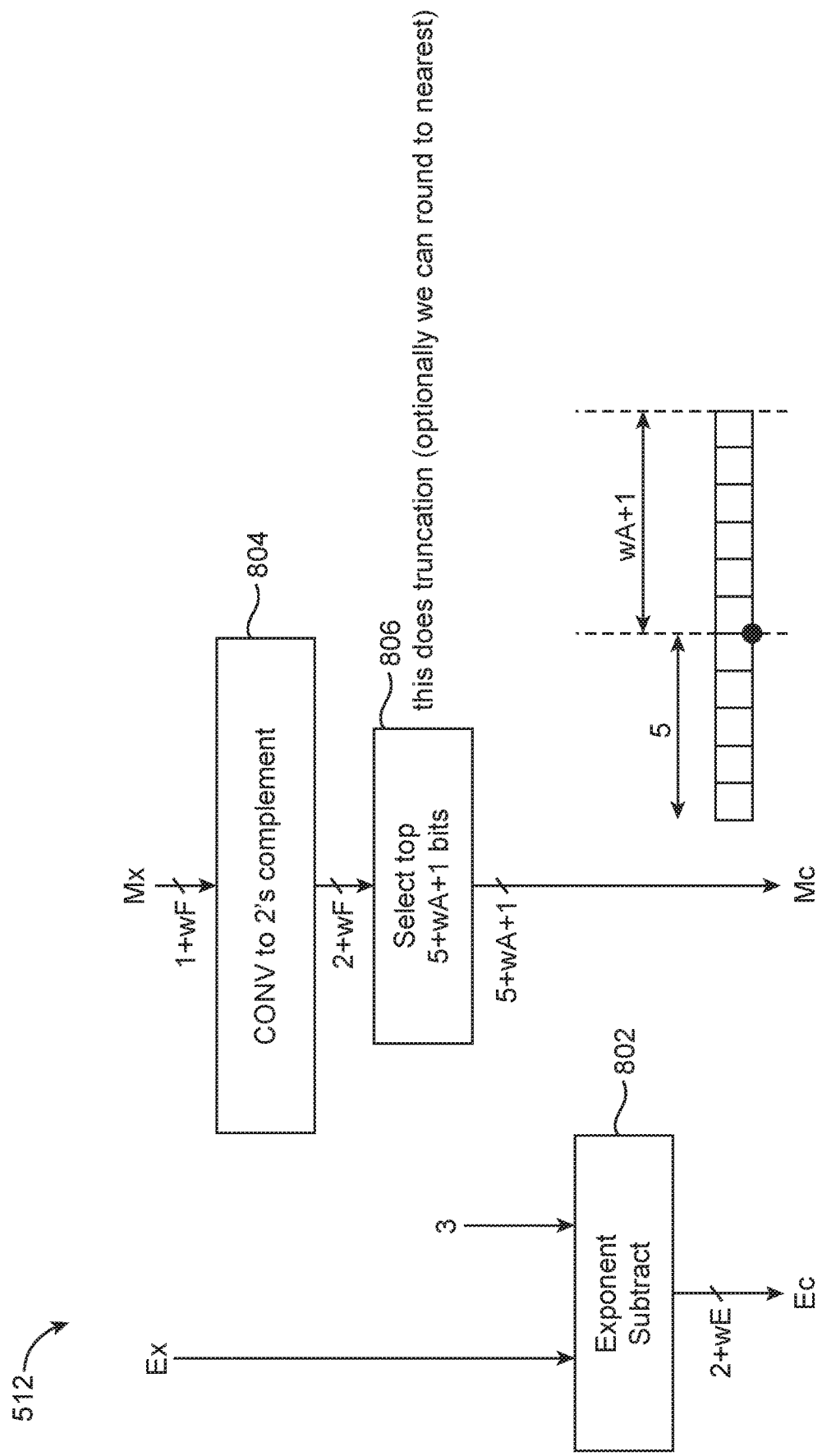
FIG. 8 is a diagram of an illustrative floating-point format conversion circuit within the hybrid floating-point dot-product circuitry shown in FIG. 5A in accordance with an embodiment.

FIG. 8 is a diagram showing one suitable implementation of such floating-point format converter 512. As shown in FIG. 8, conversion circuit 512 may include an exponent subtraction circuit 802, a circuit 804 for converting the input mantissa from (1+wF) bit width into its two's complement equivalent with (2+wF) bit width, and a bit selection circuit 806 for selecting only the top (5+wA+1) bits from the output of block 804. The remaining bits to the right of the (wA+1) fractional bits may be discarded via truncation or can optionally be rounded to nearest (e.g., by adding "1" to the bit to the immediate right of the (wA+1) bit and then truncating the result). Circuit 806 that performs truncation or rounding is sometimes referred to as a bit reduction circuit. The resulting converted mantissa Mc will have 5 bits to the left of the radix point and (wA+1) bits to the right of the radix point.

The single precision mantissa has to be aligned to the left since the custom format at the input of the second adder stage requires 4 bits to the left of the radix point. This is accomplished by shifting the mantissa to the left by 3 bit positions while ensuring that more mantissa bits can be kept to optimize for accuracy. To compensate for this shifting, exponent subtraction block 802 may be configured to subtract 3 from the input exponent value, where the converted exponent output Ec will have (2+wE) bits. The format at the output of converter is (2+wE) exponent bits and (5+wA+1) mantissa bits, which matches the numerical format output by adder 510 in the first adder stage and received at adder 520 in the second adder stage.

Figure 9:
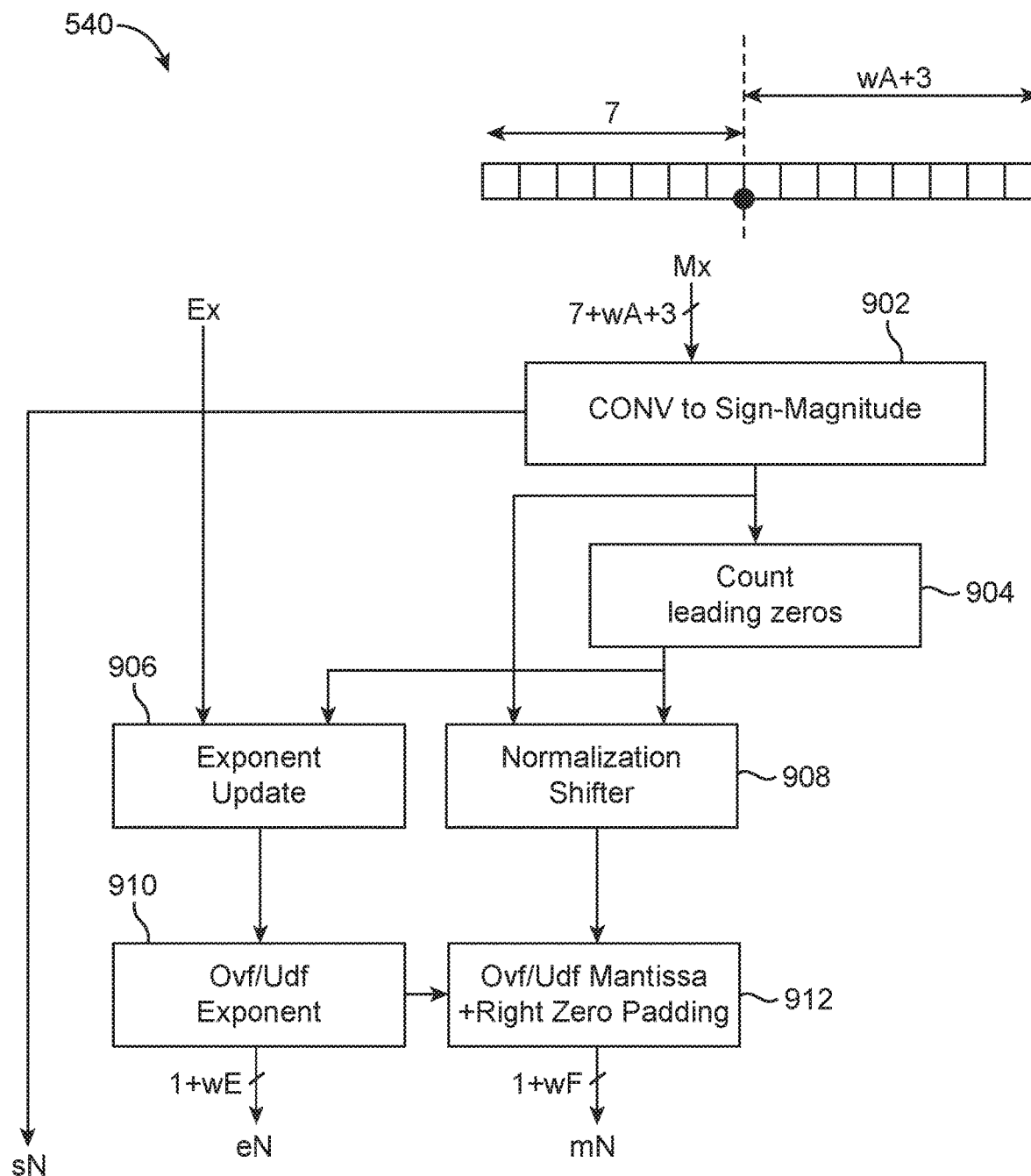
FIG. 9 is a diagram of an illustrative normalization circuit within the hybrid floating-point dot-product circuitry shown in FIG. 5A in accordance with an embodiment.

Referring briefly back again to FIG. 5A, the output of third adder stage 530 is in the custom format with (7+wA+3) mantissa bits (see FIG. 7E), and thus needs to be normalized using normalization circuit 540 prior to being combined with another single precision value at adder 190 of DSP block 120-2. FIG. 9 is a diagram of normalization circuit 540 in accordance with an embodiment. As shown in FIG. 9, normalization circuit 540 may include at least a sign-magnitude converting block 902, a leading zero counter 904, a normalization shifter 908, an exponent update block 906, an overflow/underflow exponent handling block 910, and an overflow/underflow mantissa handling and right zero padding block 912.

Since the IEEE 754 single precision format adopts a sign-magnitude representation for the mantissa, block 902 may be configured to convert the incoming mantissa with (7+wA+3) bits into the sign-magnitude format. Counter 904 may be configured to identify the number of leading zeros in the converted mantissa. Normalization shifter 908 may then shift the converted sign-magnitude value based on the number of leading zeros determined by counter 904. Block 906 may be configured to update the exponent by incrementing Ex by (6−c), where "c" denotes the number of leading zeros identified by counter 904.

Block 910 checks that the updated exponent is within the allowed bounds. For single precision and BFLOAT16, the maximum exponent is equal to 127 while the minimum exponent is equal to −126 since both formats use 8 exponent bits. If the updated exponent value is greater than 127, then normalization circuit 540 should return infinity. If the updated exponent value is less than −126, then the normalization circuit 540 should return zero. The overflow/underflow information may then be forwarded to block 912 for flushing the mantissas to all zeros if either overflow or underflow occurs. Block 912 may also handle right zero padding to make up for a total of 23 fraction bits for single precision.

Some of the more costly components in terms of ALM resource usage within the hybrid dot-product circuitry 310 are the alignment shifters such as alignment shifter block 740 within floating-point adder of the type shown in FIG. 7B, alignment shifter 758 in the first adder stage of the type shown in FIG. 7C, alignment shifter 758' in the second adder stage of the type shown in FIG. 7D, alignment shifter 758" in the third adder stage of the type shown in FIG. 7E, and normalization shifter 908 in the normalization circuit 540 of the type shown in FIG. 9. Thus, an efficient implementation of these shifters is key for optimizing the efficiency of the entire machine learning system.

Figure 10A:
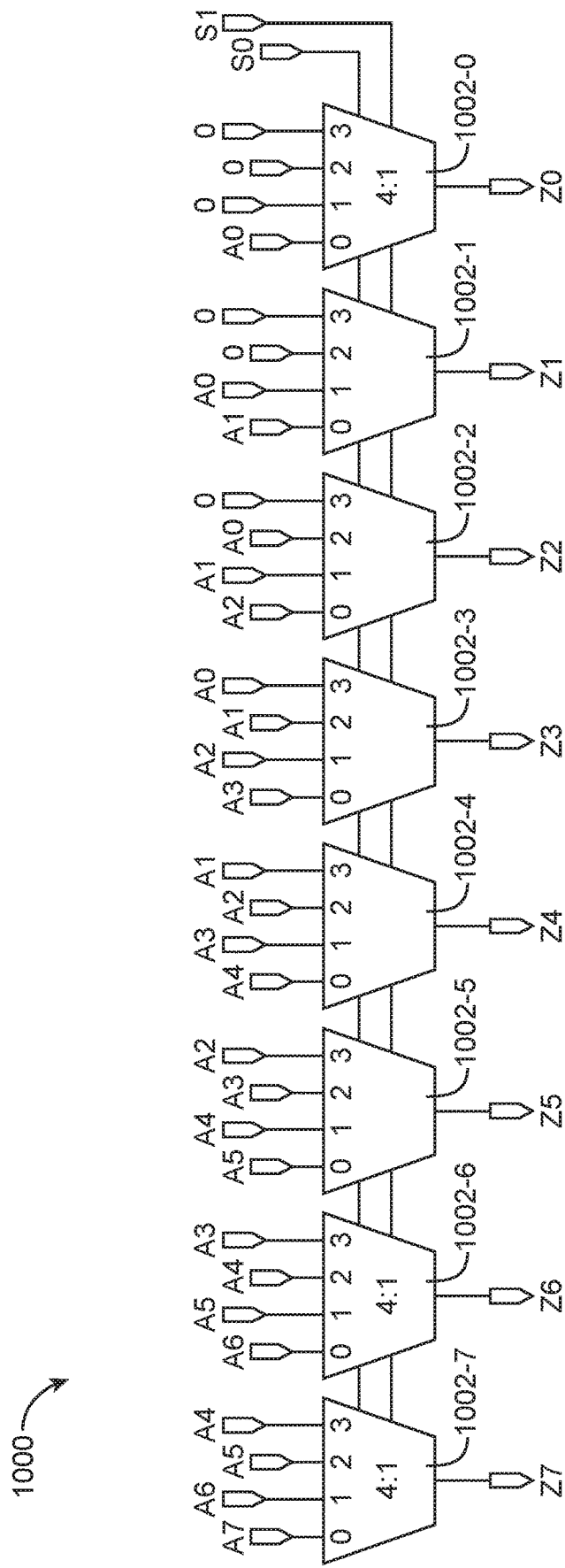
FIG. 10A is a diagram of an illustrative barrel shifter.

FIG. 10A is a diagram of a conventional barrel shifter 1000 for shifting bits left. As shown in FIG. 10A, barrel shifter 1000 receives an 8-bit input A[0:7] and control bits S[0:1] for controlling the amount of shifting performed. Barrel shifter 1000 includes: a first 4:1 multiplexer 1002-0 that receives A0 at its "0" input while the remaining inputs receive "0"; a second 4:1 multiplexer 1002-1 that receives A1 at its "0" input, A0 at its "1" input, and zeros at the remaining inputs; a third 4:1 multiplexer 1002-2 that receives A2 at its "0" input, A1 at its "1" input, A0 at its "2" input, and zero at its "3" input; a fourth 4:1 multiplexer 1002-3 that receives A3 at its "0" input, A2 at its "1" input, A1 at its "2" input, and A0 at its "3" input; a fifth 4:1 multiplexer 1002-4 that receives A4 at its "0" input, A3 at its "1" input, A2 at its "2" input, and A1 at its "3" input; a sixth 4:1 multiplexer 1002-5 that receives A5 at its "0" input, A4 at its "1" input, A3 at its "2" input, and A2 at its "3" input; a seventh 4:1 multiplexer 1002-6 that receives A6 at its "0" input, A5 at its "1" input, A4 at its "2" input, and A3 at its "3" input; and an eighth 4:1 multiplexer 1002-7 that receives A7 at its "0" input, A6 at its "1" input, A5 at its "2" input, and A4 at its "3" input.

Multiplexers 1002-0, 1002-1, 1002-2, 1002-3, 1002-4, 1002-5, 1002-6, and 1002-7 are used to generate Z[0:7], which represents the shifted output. In this arrangement, every 4:1 multiplexer 1002 implemented on an FPGA would require using a 6-input lookup table (LUT) circuit. As a result, a conventional implementation of a barrel shifter of N data bits and two control bits will require at least N 6-input LUTs.

Figure 10B:
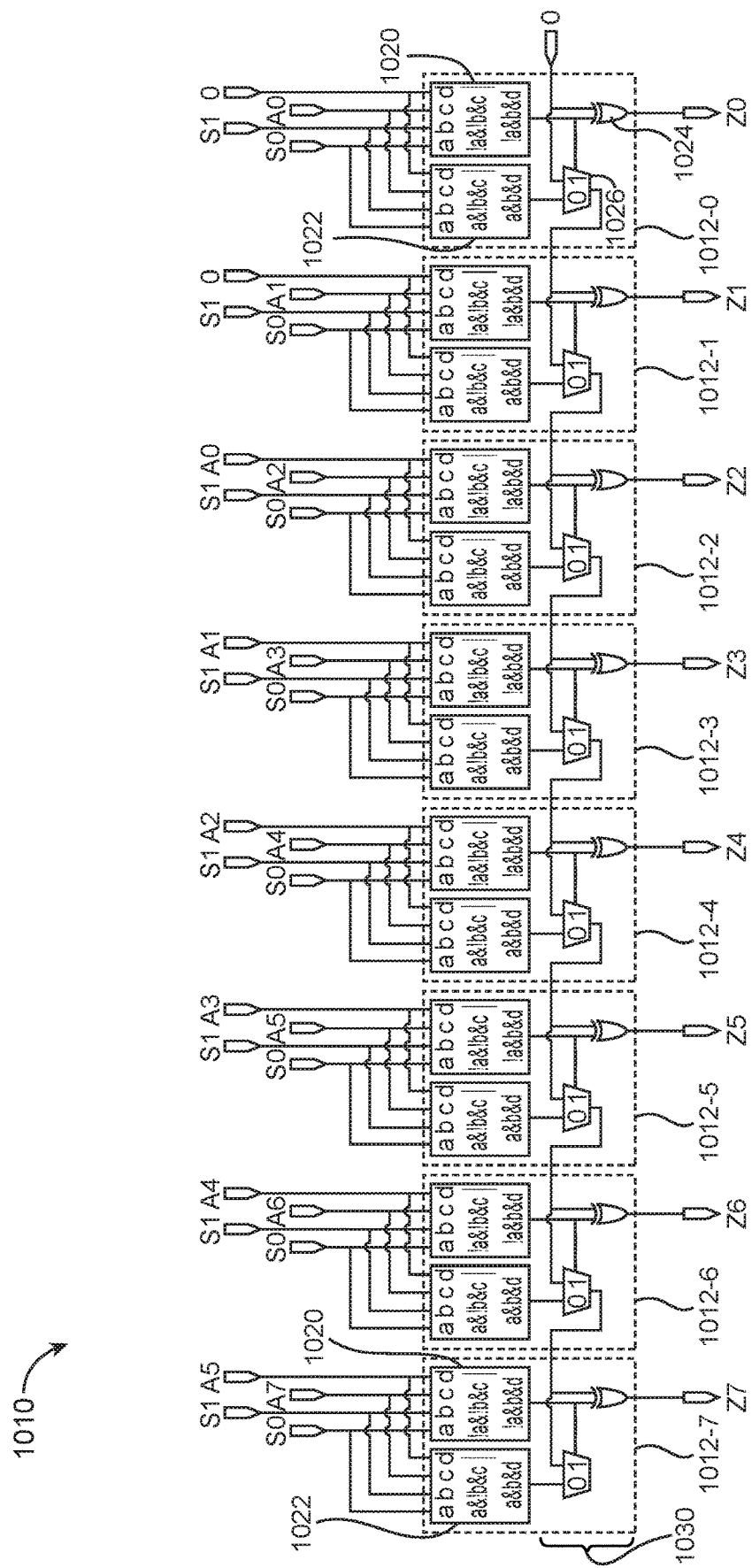
FIGS. 10B and 10C are diagrams of illustrative carry-chain based barrel shifting circuits in accordance with some embodiments.

In accordance with another suitable embodiment, a carry-chain based barrel shifter 1010 is shown in FIG. 10B. In contrast to the conventional barrel shifter of FIG. 10 (which uses a combinatorial structure relying on 4:1 multiplexers), the carry-chain based shifter 1010 uses a series of arithmetic cells 1012. Using an arithmetic based architecture instead of a combinatorial structure results in a smaller overall shifter structure that uses fewer wires, thereby improving area, power, cost, and performance.

As shown in FIG. 10B, carry-chain based barrel shifter 1010 may be configured to receive an 8-bit input A[0:7] and control bits S[0:1] for controlling the amount of shifting performed. The example of FIG. 10B in which shifter 1010 receives only eight input buts and two control bits is merely illustrative and is not intended to limit the scope of the present embodiments. If desired, the carry-chain based shifter architecture of FIG. 10B may be applied to shifters of any suitable size.

Shifter 1010 may include arithmetic cells 1012-0, 1012-1, 1012-2, 1012-3, 1012-4, 1012-5, 1012-6, and 1012-7. Each arithmetic cell 1012 with index k receives both control bits S[0:1] and two data bits A[k] and A[k−2] spaced bit distance apart. Each arithmetic cell 1012 may include a first 4-input LUT 1020 and a second 4-input LUT 1022, each of which has four input ports a, b, c, d. The first 4-input LUT 1020 may be configured to compute (!a&!b&c OR !a&b&d), where "!" represents the "not" function. The second 4-input LUT 1022 may be configured to compute (a&!b&c OR a&b&d).

Each arithmetic cell 1012 may further include a logic XOR gate 1024 having a first input that receives a carry-out from the previous arithmetic cell in the chain (e.g., the first arithmetic will receive a carry-in of "0"), a second input that receives the output of LUT 1020, and an output on which a corresponding shifted output bit is generated. Each arithmetic cell 1012 may also include a simple 2:1 multiplexer 1026 having a first (0) input that receives the output of LUT 1022, a second (1) input that receives the carry-out from the previous arithmetic cell, and an output on which a corresponding carry-out is fed to the succeeding arithmetic cell in the chain.

The input connections of each arithmetic cell 1012 are illustrated in detail in FIG. 10B. The a, b, c, and d input ports of LUTs 1020 and 1022 in both the first arithmetic cell 1012-0 and the second arithmetic cell 1012-1 may be configured to receive input bits S0, S1, A0, and 0, respectively. The a, b, c, and d input ports of LUTs 1020 and 1022 in the third arithmetic cell 1012-2 may be configured to receive input bits S0, S1, A2, and A0, respectively. The a, b, c, and d input ports of LUTs 1020 and 1022 in the fourth arithmetic cell 1012-3 may be configured to receive input bits S0, S1, A3, and A1, respectively. The a, b, c, and d input ports of LUTs 1020 and 1022 in the fifth arithmetic cell 1012-4 may be configured to receive input bits S0, S1, A4, and A2, respectively. The a, b, c, and d input ports of LUTs 1020 and 1022 in the sixth arithmetic cell 1012-5 may be configured to receive input bits S0, S1, A5, and A3, respectively. The a, b, c, and d input ports of LUTs 1020 and 1022 in the seventh arithmetic cell 1012-6 may be configured to receive input bits S0, S1, A6, and A4, respectively. The a, b, c, and d input ports of LUTs 1020 and 1022 in the eight arithmetic cell 1012-7 may be configured to receive input bits S0, S1, A7, and A5, respectively.

Arranged in this way, each arithmetic cell 1012 may be configured to perform the following operation. If S[0:1] is equal to "00", then Z=A[k] and the carry-out is zero. If S[0:1] is equal to "01", then Z=A[k−2] and the carry-out is zero. In either of these cases, the carry chain is not activated and the received input data is routed directly to the output of the same arithmetic cell.

If S[0:1] is equal to "10", then Z is equal to the received carry-in and A[k] is routed to the carry-out. If S[0:1] is equal to "11", then Z is again equal to the received carry-in and A[k−2] is routed to the carry-out. In either of these cases, the output data of that arithmetic cell is routed from the previous neighboring cell, and carry chain is activated to route the received data input to the next succeeding cell in the chain.

Compared to the implementation of FIG. 10A that uses N instances of 6-input LUTs, the architecture of FIG. 10B uses 16 or 2N 4-input LUTs. A 6-input LUT is, however, 4× bigger in size than a 4-input LUT. As a result, the shifter configuration of FIG. 10B (and 10C) will be half the area than the conventional barrel shifter, which reduces cost and power.

Figure 10C:
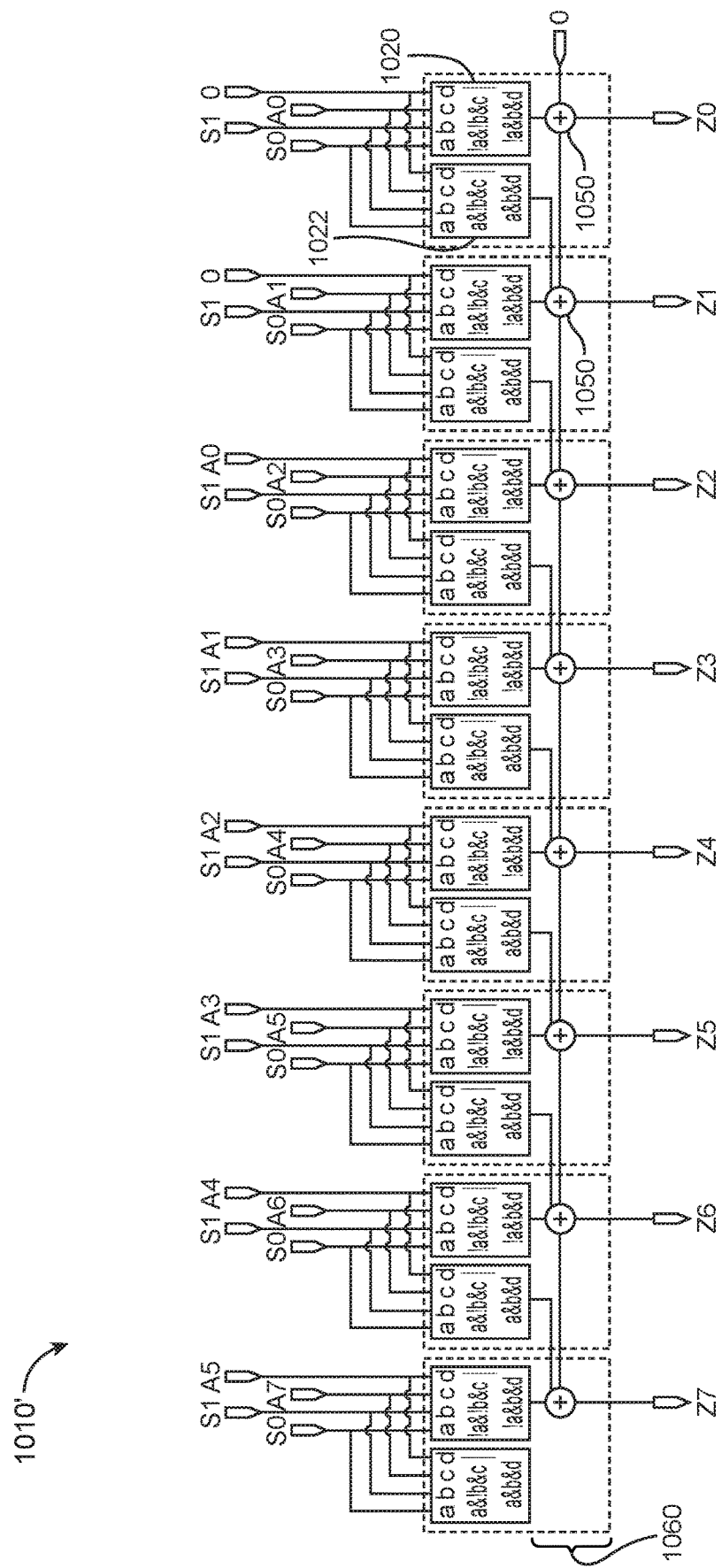

In the arrangement of FIG. 10B, the logic XOR gates 1024 and the 2:1 multiplexers 1026 in each arithmetic cell 1020 are connected in series and make up the carry chain 1030. FIG. 10C illustrates another suitable arrangement that is similar to the architecture of FIG. 10B, but the carry chain 1060 is implemented using adders 1050 connected in a chain. The first adder 1050 in the chain will also receive a carry-in of "0". The adder-chain based barrel shifter of FIG. 10B can also provide substantial area and cost savings relative to the convention barrel shifter of FIG. 10A. The improved shifting circuits of FIGS. 10B and 10C are not limited to use in machine learning training circuitry. If desired, carry-chain based shifters may be included in any type of arithmetic or compute system.

EXAMPLES

The following examples pertain to further embodiments.

Example 1 is an integrated circuit, comprising: first digital signal processing (DSP) blocks configured to operate in a floating-point mode; second digital signal processing (DSP) blocks configured to operate in a fixed-point mode that is different than the floating-point mode; and an adder configured to receive a first signal from the first DSP blocks operating in the floating-point mode and a second signal from the second DSP blocks operating in the fixed-point mode.

Example 2 is the integrated circuit of example 1, wherein the first DSP blocks are optionally part of a hard data path, and wherein the second DSP blocks are optionally part of a hard and soft data path.

Example 3 is the integrated circuit of any one of examples 1-2, wherein the first and second DSP blocks are optionally configured to receive input signals of a first floating-point format, and wherein the first DSP blocks are optionally configured to output signals in a second floating-point format that is different than the first floating-point format.

Example 4 is the integrated circuit of example 3, wherein the first floating-point format is optionally a BFLOAT16 format having one sign bit, eight exponent bits, and at most seven fraction bits.

Example 5 is the integrated circuit of any one of examples 3-4, wherein the second floating-point format is optionally a single-precision format having one sign bit, eight exponent bits, and twenty three fraction bits.

Example 6 is the integrated circuit of any one of examples 3-5, wherein the second DSP blocks are optionally configured to output signals in a third floating-point format that is different than the first and second floating-point formats.

Example 7 is the integrated circuit of example 6, wherein the third floating-point format optionally has more exponent bits than the first floating-point format.

Example 8 is the integrated circuit of any one of examples 6-7, wherein the third floating-point format optionally has an adjustable number of fraction bits that determines the amount of truncation for the third floating-point format.

Example 9 is the integrated circuit of any one of examples 6-8, optionally further comprising a format conversion circuit configured to convert signals from the second floating-point format to the third floating-point format.

Example 10 is the integrated circuit of any one of examples 6-9, wherein the second DSP blocks optionally rely on soft logic to support outputting the signals in the third floating-point format.

Example 11 is the integrated circuit of example 10, optionally further comprising first adder circuits configured to receive the signals from the second DSP blocks and to output signals in a fourth floating-point format that is different than the third floating-point format.

Example 12 is the integrated circuit of example 11, optionally further comprising an adder tree configured to receive signals from the first adder circuits.

Example 13 is the integrated circuit of example 12, wherein the adder tree optionally comprises a first adder stage configured to output signals in a fifth floating-point format that is different than the fourth floating-point format.

Example 14 is the integrated circuit of example 13, wherein the adder tree optionally comprises a second adder stage configured to output signals in a sixth floating-point format that is different than the fifth floating-point format.

Example 15 is the integrated circuit of example 14, wherein the adder tree optionally comprises a third adder stage configured to output signals in a seventh floating-point format that is different than the sixth floating-point format.

Example 16 is the integrated circuit of example 15, optionally further comprising a normalization circuit configured to receive signals from the adder tree and to convert signals from the seventh floating-point format to the second floating-point format.

Example 17 is hybrid floating-point arithmetic circuitry, comprising: a first portion that includes only hard circuit blocks; a second portion that includes both hard and soft circuits; and an adder in the first portion, wherein the adder is configured to receive a first signal from the first portion and to receive a second signal from the second portion.

Example 18 is the hybrid floating-point arithmetic circuitry of example 17, wherein the hard circuit blocks in the first portion optionally comprise first digital signal processing (DSP) blocks operating in floating-point mode, and wherein the hard circuits in the second portion optionally comprise digital signal processing second digital signal processing (DSP) blocks operating in a fixed-point mode that is different than the floating-point mode.

Example 19 is the hybrid floating-point arithmetic circuitry of any one of examples 17-18, wherein second portion is optionally configured to receive input signals from a feeder circuit, and wherein the first portion is optionally configured to receive input signals from the feeder circuit via a plurality of input delay registers to account for latency imbalance between the first and second portions.

Example 20 is hybrid floating-point dot-product circuitry, comprising: a hard data path that includes digital signal processing (DSP) blocks configured in a floating-point mode; a hard and soft data path that includes soft logic and digital signal processing (DSP) blocks configured in a fixed-point mode; an adder configured to receive signals from the hard data path and the hard and soft data path; and an accumulation storage circuit configured to receive signals from the adder, wherein an additional adder in the hard data path is configured to receive an accumulation signal from the accumulation storage via a feedback path.

Example 21 is circuitry, comprising: a two-element dot-product circuit configured to receive first, second, third, and fourth inputs, to generate a first intermediate product from the first and second inputs, to generate a second intermediate product from the third and fourth inputs, and to compute a sum of the first and second intermediate products, wherein the two-element dot-product circuit comprises a first multiplier that generates the first intermediate product and a second multiplier that generates the second intermediate product, and wherein the first multiplier comprises: an exponent adder circuit configured to add the exponent of the first input and the exponent of the second input, wherein the exponent adder circuit is configured to directly generate the exponent of the first intermediate product.

Example 22 is the circuitry of example 21, wherein the first multiplier optionally directly generates the exponent of the first intermediate product without an exponent update circuit.

Example 23 is the circuitry of any one of examples 21-22, wherein the first multiplier optionally directly generates the exponent of the first intermediate product without an overflow and overflow checking circuit.

Example 24 is the circuitry of any one of examples 21-23, wherein the first multiplier optionally further comprises: a mantissa multiplier circuit configured to multiply the mantissa of the first input and the mantissa of the second input; and a bit truncation circuit configured to receive signals directly from the mantissa multiplier circuit and to directly generate the mantissa of the first intermediate product.

Example 25 is the circuitry of example 24, wherein the bit truncation circuit is optionally configured to perform an adjustable amount of mantissa truncation to balance resource usage with accuracy.

Example 26 is the circuitry of any one of examples 24-25, wherein the first multiplier optionally directly generates the mantissa of the first intermediate product without a normalization circuit.

Example 27 is the circuitry of any one of examples 24-26, wherein the first multiplier optionally directly generates the mantissa of the first intermediate product without a rounding circuit.

Example 28 is the circuitry of any one of examples 21-27, wherein the two-element dot-product circuit optionally further includes an adder circuit configured to compute the sum of the first and second intermediate products, and wherein the adder circuit optionally comprises: an exponent multiplexing circuit configured to select either the exponent of the first intermediate product or the exponent of the second intermediate product, wherein the exponent multiplexing circuit is further configured to directly generate the exponent of the sum.

Example 29 is the circuitry of example 28, wherein the adder circuit optionally directly outputs the exponent of the sum without an exponent update circuit.

Example 30 is the circuitry of any one of examples 28-29, wherein the adder circuit optionally further comprises: a mantissa swapping circuit having a first output and a second output; a first two's complement conversion circuit configured to receive a first mantissa value from the first output of the mantissa swapping circuit; and a second two's complement conversion circuit configured to receive a second mantissa value from the second output of the mantissa swapping circuit.

Example 31 is the circuitry of any one of examples 28-30, wherein the adder circuit optionally generates the mantissa of the sum without a sign-magnitude converter.

Example 32 is the circuitry of any one of examples 28-31, wherein the adder circuit optionally generates the mantissa of the sum without a leading zero counter and without a normalization shifter.

Example 33 is the circuitry of any one of examples 28-32, wherein the adder circuit optionally generates the mantissa of the sum without a rounding circuit.

Example 34 is the circuitry of any one of examples 28-33, wherein the adder circuit optionally further comprises: an integer adder; and a bit truncation circuit configured to receive signals from the integer adder and to directly output the mantissa of the sum.

Example 35 is the circuitry of any one of examples 21-34, optionally further comprising: additional two-element dot-product circuits; and an adder tree configured to receive sum signals from the two-element dot-product circuit and the additional two-element dot-product circuits, wherein the adder tree comprises a first stage adder that includes: a mantissa swapping circuit; and an alignment shifter that directly receives a signal from the mantissa swapping circuit.

Example 36 is the circuitry of example 35, wherein the adder tree further optionally comprises a second stage adder having the same structure as the first stage adder but is configured to generate signals with a larger mantissa than the first stage adder.

Example 37 is circuitry, comprising: a plurality of dot-product circuits configured to output sum signals; an adder tree configured to receive the sum signals from the plurality of dot-product circuits; a digital signal processing (DSP) block configured to output an additional sum signal in a given floating-point format; and a floating-point format conversion circuit configured to convert the additional sum signal from a given floating-point format to another floating-point format of the adder tree.

Example 38 is the circuitry of example 37, wherein the floating-point format conversion circuit optionally comprises: an exponent subtraction circuit configured to subtract the exponent of the additional sum signal by a predetermined integer; a two's complement converter circuit configured to receive the mantissa of the additional sum signal; and a bit reduction circuit configured to receive signals from the two's complement converter circuit and to directly output a converted mantissa value to the adder tree.

Example 39 is circuitry, comprising: a plurality of dot-product circuits configured to output sum signals; an adder tree configured to receive the sum signals from the plurality of dot-product circuits; and a normalization circuit configured to receive an output signal from the adder tree and to convert the output signal from a first floating-point format to a second floating-point format that is different than the first floating-point format.

Example 40 is the circuitry of example 39, wherein the normalization circuit optionally comprises: a sign-magnitude converter configured to receive the mantissa of the output signal; a leading zero counter coupled to the sign-magnitude converter; a normalization shifter controlled by the leading zero counter; and a zero padding circuit configured to receive signals from the normalization shifter.

Example 41 is circuitry, comprising: a plurality of dot-product circuits configured to output sum signals; and an adder tree configured to receive the sum signals from the plurality of dot-product circuits, wherein the plurality of dot-product circuits and the adder tree comprise carry chain based shifting circuits.

Example 42 is the circuitry of example 41, wherein the plurality of dot-product circuits are optionally configured to receive inputs having a first floating-point format.

Example 43 is the circuitry of example 42, wherein the first floating-point format is optionally a BFLOAT16 format having one sign bit, eight exponent bits, and seven fraction bits.

Example 44 is the circuitry of any one of examples 42-43, wherein the output sum signals optionally have a second floating-point format that is different than the first floating-point format.

Example 45 is the circuitry of example 44, wherein the second floating-point format optionally has more exponent bits than the first floating-point format.

Example 46 is the circuitry of any one of examples 44-45, wherein the second floating-point format optionally has an adjustable number of fraction bits that determines the amount of truncation for the second floating-point format.

Example 47 is the circuitry of any one of examples 41-46, wherein at least one of the carry chain based shifting circuits optionally comprise a series of arithmetic cells connected in a chain.

Example 48 is the circuitry of example 47, wherein at least one arithmetic cell in the series optionally comprises: a first lookup table configured to provide a first function; and a second lookup table configured to provide a second function that is different than the first function.

Example 49 is the circuitry of example 48, wherein the first and second lookup tables are optionally configured to receive the same input signals.

Example 50 is the circuitry of any one of examples 48-49, wherein the at least one arithmetic cell optionally further comprises a logic gate configured to receive signals from the first lookup table.

Example 51 is the circuitry of example 50, wherein the logic gate optionally comprises a logic XOR gate.

Example 52 is the circuitry of any one of examples 50-51, wherein the at least one arithmetic cell optionally further comprises a multiplexing circuit configured to receive signals from the second lookup table, and wherein the multiplexing circuit is optionally controlled by the signals output from the first lookup table.

Example 53 is the circuitry of any one of examples 48-52, wherein the at least one arithmetic cell optionally further comprises an adder configured to receive signals from the first lookup table.

Example 54 is the circuitry of example 53, wherein the adder is optionally coupled to at least one other arithmetic cell in the chain.

Example 55 is a shifting circuit, comprising: a first arithmetic cell; and a second arithmetic cell coupled to the first arithmetic cell in a chain, wherein the first and second arithmetic cells include a carry chain that generates shifted output bits.

Example 56 is the shifting circuit of example 55, wherein the first arithmetic cell is optionally configured to receive a first input bit and a control bit, and wherein the second arithmetic cell is optionally configured to receive a second input bit and the control bit.

Example 57 is the shifting circuit of any one of examples 55-56, wherein the first and second arithmetic cells optionally have identical structures.

Example 58 is the shifting circuit of any one of examples 55-57, wherein the carry chain optionally comprises a plurality of logic gates and multiplexing circuits connected in series.

Example 59 is the shifting circuit of any one of examples 55-58, wherein the carry chain optionally comprises a plurality of adders connected in series.

Example 60 is a bit shifting circuit, comprising: first four-input lookup tables configured to receive input signals and to apply a first function on the input signals; second four-input lookup tables configured to receive the input signals and to apply a second function that is different than the first function on the input signals; and a carry chain configured to receive signals output from the first and second four-input lookup tables and to generate a shifted version of the input signals.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   first digital signal processing (DSP) blocks configured to operate in a floating-point mode;
   second digital signal processing (DSP) blocks configured to operate in a fixed-point mode that is different than the floating-point mode; and
   an adder configured to receive a first signal from the first DSP blocks operating in the floating-point mode and a second signal from the second DSP blocks operating in the fixed-point mode.

2. The integrated circuit of claim 1, wherein the first DSP blocks are part of a hard data path, and wherein the second DSP blocks are part of a hard and soft data path.

3. The integrated circuit of claim 1, wherein the first and second DSP blocks are configured to receive input signals of a first floating-point format, and wherein the first DSP blocks are configured to output signals in a second floating-point format that is different than the first floating-point format.

4. The integrated circuit of claim 3, wherein the first floating-point format is a BFLOAT16 format having one sign bit, eight exponent bits, and at most seven fraction bits.

5. The integrated circuit of claim 3, wherein the second floating-point format is a single-precision format having one sign bit, eight exponent bits, and twenty three fraction bits.

6. The integrated circuit of claim 3, wherein the second DSP blocks are configured to output signals in a third floating-point format that is different than the first and second floating-point formats.

7. The integrated circuit of claim 6, wherein the third floating-point format has more exponent bits than the first floating-point format.

8. The integrated circuit of claim 6, wherein the third floating-point format has an adjustable number of fraction bits that determines the amount of truncation for the third floating-point format.

9. The integrated circuit of claim 6, further comprising a format conversion circuit configured to convert signals from the second floating-point format to the third floating-point format.

10. The integrated circuit of claim 6, wherein the second DSP blocks rely on soft logic to support outputting the signals in the third floating-point format.

11. The integrated circuit of claim 10, further comprising first adder circuits configured to receive the signals from the second DSP blocks and to output signals in a fourth floating-point format that is different than the third floating-point format.

12. The integrated circuit of claim 11, further comprising an adder tree configured to receive signals from the first adder circuits.

13. The integrated circuit of claim 12, wherein the adder tree comprises a first adder stage configured to output signals in a fifth floating-point format that is different than the fourth floating-point format.

14. The integrated circuit of claim 13, wherein the adder tree comprises a second adder stage configured to output signals in a sixth floating-point format that is different than the fifth floating-point format.

15. The integrated circuit of claim 14, wherein the adder tree comprises a third adder stage configured to output signals in a seventh floating-point format that is different than the sixth floating-point format.

16. The integrated circuit of claim 15, further comprising a normalization circuit configured to receive signals from the adder tree and to convert signals from the seventh floating-point format to the second floating-point format.

17. Hybrid floating-point arithmetic circuitry, comprising:
a first portion that includes only hard circuit blocks;
a second portion that includes both hard and soft circuits; and
an adder in the first portion, wherein the adder is configured to receive a first signal from the first portion and to receive a second signal from the second portion.

18. The hybrid floating-point arithmetic circuitry of claim 17, wherein the hard circuit blocks in the first portion comprise first digital signal processing (DSP) blocks operating in floating-point mode, and wherein the hard circuits in the second portion comprise digital signal processing second digital signal processing (DSP) blocks operating in a fixed-point mode that is different than the floating-point mode.

19. The hybrid floating-point arithmetic circuitry of claim 17, wherein second portion is configured to receive input signals from a feeder circuit, and wherein the first portion is configured to receive input signals from the feeder circuit via a plurality of input delay registers to account for latency imbalance between the first and second portions.

20. Hybrid floating-point dot-product circuitry, comprising:
a hard data path that includes digital signal processing (DSP) blocks configured in a floating-point mode;
a hard and soft data path that includes soft logic and digital signal processing (DSP) blocks configured in a fixed-point mode;
an adder configured to receive signals from the hard data path and the hard and soft data path; and
an accumulation storage circuit configured to receive signals from the adder, wherein an additional adder in the hard data path is configured to receive an accumulation signal from the accumulation storage via a feedback path.

* * * * *